United States Patent [19]
Rao

[11] Patent Number: 5,969,517
[45] Date of Patent: Oct. 19, 1999

[54] APPARATUS FOR PERFORMING QUANTITATIVE MEASUREMENT OF DC AND AC CURRENT FLOW IN INTEGRATED CIRCUIT INTERCONNECTS BY MEASUREMENT OF MAGNETIC FIELDS WITH A MAGNETO OPTIC LASER PROBE

[75] Inventor: Valluri Ramana M. Rao, Saratoga, Calif.

[73] Assignee: Intel Corporation, Santa Clara, Calif.

[21] Appl. No.: 09/024,008

[22] Filed: Feb. 13, 1998

Related U.S. Application Data

[62] Division of application No. 08/711,317, Sep. 3, 1996, which is a continuation of application No. 08/222,474, Mar. 31, 1994, abandoned.

[51] Int. Cl.$^6$ .................................................. G01R 31/00
[52] U.S. Cl. ..................... 324/96; 324/750; 324/244.1; 324/753
[58] Field of Search ............................. 324/96, 244.1, 324/750, 753

[56] References Cited

U.S. PATENT DOCUMENTS

| | | | |
|---|---|---|---|
| 3,605,013 | 9/1971 | Yoshikawa et al. | 324/96 |
| 4,242,635 | 12/1980 | Burns | 324/158 |
| 4,516,073 | 5/1985 | Doriath et al. | 324/244 |
| 4,560,867 | 12/1985 | Papuchon et al. | 250/225 |
| 4,618,819 | 10/1986 | Mourou et al. | 324/77 |
| 4,894,608 | 1/1990 | Ulmer, Jr. | 324/96 |
| 4,933,629 | 6/1990 | Kozuka et al. | 324/96 |
| 4,947,107 | 8/1990 | Doerfler et al. | 324/96 |
| 4,956,607 | 9/1990 | Abe et al. | 324/244.1 |
| 4,996,475 | 2/1991 | Takahashi et al. | 324/96 |
| 5,134,362 | 7/1992 | Ochi | 324/96 |
| 5,451,863 | 9/1995 | Freeman | 324/96 |

OTHER PUBLICATIONS

Ann N. Campbell, Edward J. Cole, Jr., Bruce A. Dodd and Richard E. Anderson, Magnetic Force Microscopy/Current Contrast Imaging: A New Technique For Internal Current Probing Of IC's.

A. Birolini, M. ciappa and E. Wolfgang, "Electron And Optical Beam Testing Of Electronic Devices" Microelectronic Engineering vol. 24, Nos. 1–4 Mar. 1994, pp. 11–22.

K. Helmreich, P. Nagel, W. Wolz, K.D. Muller–Glaser, "Investigations On Chip–Internal Current Contrast Imaging And Measurement Using An Electron Beam Tester," 3rd European Conference On Electron And Optical Beam Testing Of Integrated Circuites, Sep. 9–11, 1991, pp. 152–161.

R. Wolfe, E.M. Gyorgy, R. A. Lieberman, V.J. fratello, S.J. Licht, M. N. Deeter and G. W. Day, "High Frequency Magnetic Field Sensors Based On The Faraday Effect In Garnet Thick Films," Applied Physics Letters 60(17) Apr. 1992, pp. 2048–2050.

Fred Unterseher, Jeannene Hansen, Bob Schlesinger, "Making Holograms the Easy Way", Holography Handbook, Ross Books. p. 241 (Date Unavailable).

Roger F. Belt and John B. Inges, "Growth Of Bismuth Garnet Films For High Figure Of Merit Faraday Effects Devices", Airtron div. of Litton Industries Inc. SPIE vol. 753 Acousto–Optic, Electro–optic, and Magneto–Optic Devices and Application (1987) pp. 142–149. (Month Unavailable).

*Primary Examiner*—Josie Ballato
*Assistant Examiner*—Russell M. Kobert
*Attorney, Agent, or Firm*—Blakely, Sokoloff, Taylor & Zafman

[57] ABSTRACT

A laser probe for measuring a magnetic field is disclosed. A polarized laser beam is passed through a magneto-optic crystal in the presence of an unknown magnetic field. The rotation of the polarization which occurs through the magneto-optic crystal is measured in order to determine the magnitude of the magnetic field. The measured magnetic field is used to determine, for example, the current through a conductor such as an interconnect line on a semiconductor chip. A method of calibrating the magnetic field using a known magnetic from a solenoid is also disclosed. Further disclosed is a method of providing a zero-reference current by momentarily stopping the chip clock.

15 Claims, 21 Drawing Sheets

APPARATUS FOR PERFORMING QUANTITATIVE MEASUREMENT OF DC AND AC CURRENT FLOW IN INTEGRATED CIRCUIT INTERCONNECTS BY MEASUREMENT OF MAGNETIC FIELDS WITH A MAGNETO OPTIC LASER PROBE

This is a divisional of application Ser. No. 08/711,317, filed Sep. 3, 1996, now pending, which is a continuation of application Ser. No. 08/222,474, filed Mar. 31, 1994, now abandoned.

BACKGROUND OF THE INVENTION

1. Field of the Invention

The present invention relates to the measurement of electrical current through a conductor, and more specifically to the measurement of current through an interconnection line on a semiconductor device.

2. Background Information

In the semiconductor industry, it is important to characterize the internal current flow in a semiconductor device such as, for example, a microprocessor. Often, computer simulations are performed to determine the current flow under various operating conditions. With the knowledge of the current flow, and therefore the power distribution, various performance and reliability concerns can be addressed, to allow for improved performance and reliability in the functioning device.

While computer simulations are useful to characterize the chip, it is desirable to measure the actual values of the internal current for a better understanding of the chip. However, there is currently no way to measure the current flow in semiconductor interconnection lines ("interconnect" lines) without cutting the lines or altering the lines in some way. While Hall probes can be used to measure currents on printed circuit boards, these devices typically have a spatial resolution on the order of several thousandths of an inch (mils), which is completely inadequate for semiconductor devices. Magneto transistors and magneto diodes have greater sensitivity than Hall probes and are smaller than Hall probes, but are still too large to provide the necessary spatial resolution for probing interconnect lines. Another approach is to use super conductive quantum interference devices (squids) which comprise two Josephson Junctions arranged back-to-back. One problem with this method is that it requires extremely low temperatures, so that the system is difficult to implement and costly. A further method of measuring current is E-beam probing. However, it is very difficult to separate the voltage contrast from the magnetic contrast, so that this method may not be sufficiently sensitive for measuring currents in interconnect lines. Additionally, since this must be carried out in a vacuum, this method requires the construction of a prober interface which can be placed under vacuum. Another method which has been proposed is use of magnetic force microscopy. In this method, a magnetized probe tip attached to a cantilever is scanned across an interconnect line. The deflection of the cantilever is used to determine the magnetic field, which is used to calculate current. One drawback of this method is that the frequency of the current must be approximately the same as the natural resonance frequency of the cantilever. A further drawback of this method is the relatively low sensitivity for dc currents.

What is needed is a method and apparatus for measuring current flow in an interconnection line of a semiconductor device. The method and apparatus should provide for measurement of current flow without alteration of the interconnection line. Further, the method and apparatus itself should not effect the current flow through the interconnection line, so that the measurement is an accurate reflection of current flow in the functioning device. The method and apparatus should allow for measurement of current flow without requiring that the device being tested, and/or any associated equipment be placed under vacuum or be placed in a very low temperature environment. The method and apparatus should have a spatial resolution sufficient to measure current flow in an interconnection line typical of semiconductor devices, such as microprocessors. The method and apparatus should be insensitive to current flows through other closely spaced interconnection lines to the line of interest or should provide a method of determining the contribution of these closely spaced line to the measured current, to allow for calculation of the current through the line of interest alone. The method and apparatus should be sufficiently sensitive to provide accurate measurement of the ac and dc components of currents typical of semiconductor device interconnection lines.

SUMMARY OF THE INVENTION

A method and apparatus for measuring a magnetic field of, for example, an interconnection line, and calculating current through the line from the measured magnetic field, is provided. In the present invention, a polarized beam of radiation is passed through a material which rotates the beam in the presence of a magnetic field. The rotation is measured and used to determine the magnetic field caused by interconnection line, which in turn is used to calculate the current through the line. In the present invention, methods and apparatuses for calibration to eliminate the effect of variations in the material's Faraday rotation, due to such effects as temperature variations, are also described. Additionally, a method and apparatus for providing a zero current reference is provided.

Additional features and benefits of the present invention will become apparent from the detailed description, figures, and claims set forth below.

BRIEF DESCRIPTION OF THE DRAWINGS

The present invention is illustrated by way of example and not limitation in the accompanying figures in which.

DETAILED DESCRIPTION

A laser current probe is disclosed. In the following description, numerous specific details are set forth such as specific materials, devices, equipment, schematics, testing methods, dimensions, etc. in order to provide a thorough understanding of the present invention. It will be obvious, however, to one skilled in the art that these specific details need not be employed to practice the present invention. In other instances, well known materials or methods have not been described in detail in order to avoid unnecessarily obscuring the present invention.

Figure 1:
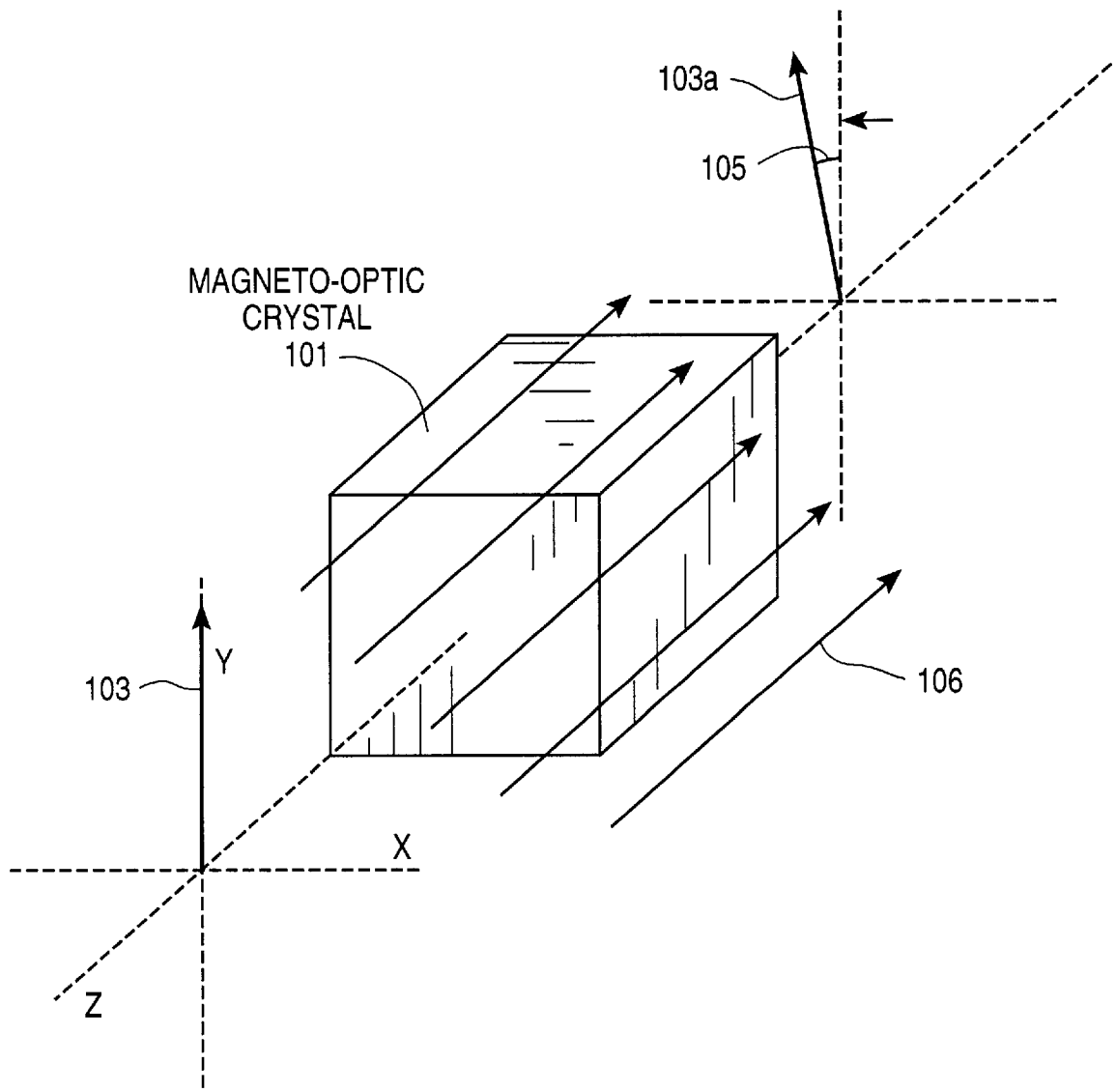
FIG. 1 illustrates the Faraday rotation effect in a magneto-optic crystal in the presence of a magnetic field.

FIG. 1 illustrates the effect of magneto-optic crystal 101 on a beam of radiation in the presence of a magnetic field. As used herein, a magneto-optic material is a material that alters the properties of radiation, such as the angle of polarization, transmitted therethrough in the presence of a magnetic field. When incident electromagnetic radiation having a polarization along, for example, the y-axis as shown by vector 103 passes through M-O crystal 101 in the presence of a magnetic field, a rotation in the polarization, known as Faraday rotation, occurs as shown by vector 103a, which has been rotated by an amount shown by angle 105. The amount of rotation is proportional to the component of the magnetic field parallel to the direction of propagation of the radiation. As shown, the polarization is rotated in the direction of -x in the coordinates of FIG. 1. The rotation in the polarization is also proportional to a physical property of the film which is characterized by a proportionality constant know as the Verdet constant. This relationship is shown by equation 1, as follows:

1) $\theta = V \int B \cdot dz$ where the angle 105 of FIG. 1 is denoted by $\theta$, $B_y$ is the component of the magnetic field parallel to the direction of propagation of the radiation, V is the Verdet constant of the M-O film, and dz is the distance the radiation travels through the crystal 101. The integral $\int B \cdot dz$ is known as the "Figure of Merit".

Figure 2:
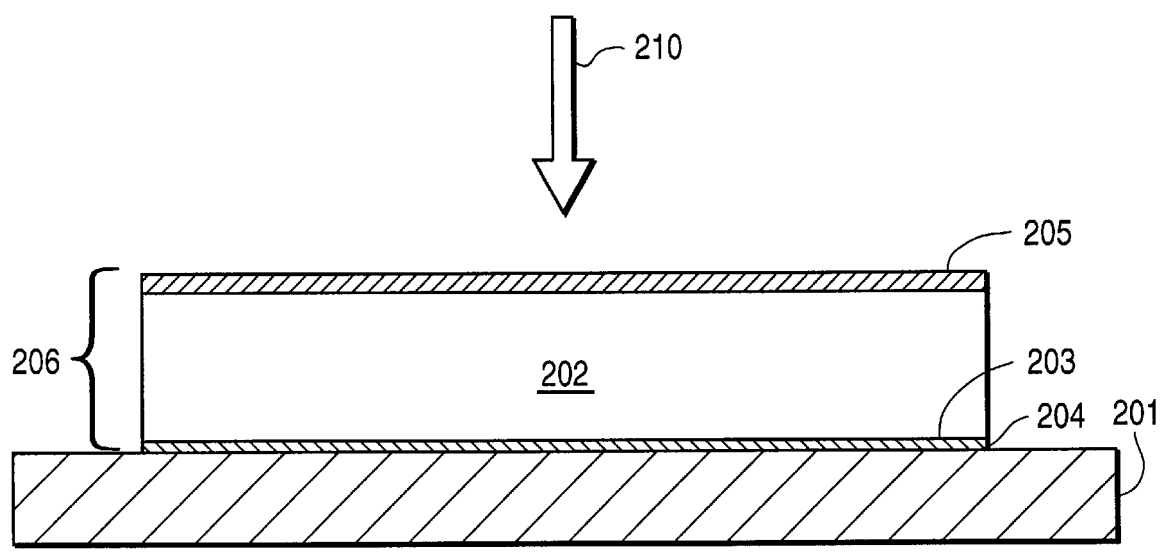
FIG. 2 shows a schematic illustration of the use of a magneto-optic crystal used to determine the current in an interconnect line on a semiconductor device.

In the present invention, the angle of rotation of the polarization caused by the magnetic field is measured, as will be described generally in conjunction with FIG. 2 and in greater detail in conjunction with FIGS. 6–7. With the measured rotation, the Figure of Merit can be determined if V is known or can be determined. From the Figure of Merit and known geometry of the interconnect line in relation to the position of the crystal, the current through the interconnect line can be determined. In the case of a uniform magnetic field, the Figure of Merit is equal to the magnetic field multiplied by the distance through the crystal. However, the magnetic field due to a current through an interconnect line is not uniform, so that the magnetic field/unit current as a function of position in the crystal must be known in order to determine the current from the measured rotation. The magnetic field due to a current in a conductor at a point in space can be determined from the Biot-Savart law, which expresses magnetic field as proportional to the current and as a function of position in x, y, and z, f(x,y,z). Therefore, using this notation in equation (1), the measured rotation $\theta_{mi}$, due to the magnetic field caused by the current through the interconnect line, $I_{ic}$, can be expressed as:

2) $\theta_{mi} = V I_{ic} \int f(x,y,z) dz$ where f(x,y,z) represents the magnetic field as a function of position in the M-O crystal, and where the integration is carried out through the thickness of the M-O crystal through which the radiation passes. In the present invention, f(x,y,z) is calculated along the direction of the laser beam through the crystal for the known geometry of the line being measured, on a per unit of current basis. A detailed example of the function f(x,y,z) is given at the end of the specification in the section entitled "Magnetic Field Calculation." An example of a computer program which calculates this function is given in Appendix A. With this calculation, the current, $I_{ic}$, causing the rotation in polarization, $\theta_{mi}$, can be determined if V is known.

As will be seen, the present invention provides a method of calibration such that the Verdet constant need not be known in order to determine the magnetic field caused by an interconnection line. This is particularly important since the Verdet constant for most M-O films is not a constant over all conditions and is, for example, a generally unknown function of film temperature, which depends upon, for example, the heat dissipation of the chip, and other factors. Therefore, in the present invention, the rotation caused by a known, constant magnetic field generated by a solenoid is measured. Since the field is constant, equation (1) for the field caused by the solenoid becomes:

3) $\theta_{ms} = V B_s t$ where $\theta_{ms}$ is the measured rotation caused by the solenoid field, $B_S$ is the known magnetic field of the solenoid, and t is the thickness of the crystal. As will be described, the measurement of rotation from the known field is carried out simultaneously with measurement of rotation from the interconnect line, so that the conditions of the two measurements, such as temperature, alignment of system components, etc., are identical. Dividing equation (2) by equation (3):

$$4) \quad \frac{\theta_{mi}}{\theta_{ms}} = \frac{V I_{ic} \int f(x, y, z) dz}{V B_s t} = \frac{I_{ic} \int f(x, y, z) dz}{B_s t}$$

rearranging, and denoting the ratio $$\frac{\theta_{mi}}{\theta_{ms}}$$

as α:

$$I_{iC} = \frac{\alpha B_s t}{\int f(x, y, z) dz} \qquad 5)$$

From equation (5) it can be seen that $I_{ic}$ can now be determined since α is a ratio of two measured values, $B_S$, the field of the solenoid, is known, t, the thickness of M-O film, is known, and the integral in the denominator is calculated. As can be seen from equation (4), V, which is a function of temperature and possibly other factors, has been eliminated from the calculation.

The general principle used for the measurement of the angle θ will now be described. First, FIG. 2 shows a schematic diagram of a device having an interconnection line being probed according to the present invention. Device 201, such as, for example, a single chip, is coupled to a tester (not shown) which has means for making electrical connection to the bonding pads of the chip and for providing the appropriate voltages and signals to test the operation of the chip. The tester can be any of the known testers typically used at the back-end of device fabrication used to test the functionality of the chip. Substrate 202 having magneto-optic (M-O) film 203 thereon is placed in close proximity to the line to be tested. The side of the substrate 202 not having M-O film 203 is coated with broad band anti-reflective coating 205. Anti-reflective coating 205 helps prevent excessive loss of incoming incident laser beam 210 by reflection. As shown, incident laser beam 210 passes through the substrate 202 and M-O film 203. Laser beam 210 then reflects off of dielectric mirror 204, and then again passes through M-O film 203. As will be seen, the rotation of this reflected beam is then measured. Dielectric mirror 204 is designed to reflect a relatively high percentage of light at the wavelength of laser beam 210. Additionally, it is desirable that the dielectric mirror transmit a sufficient percentage of light in other portions of the spectrum, to allow for optical imaging. Alternatively, the laser beam 210 may be reflected off the interconnect line itself. However, the interconnect line may have an anti-reflective coating which was applied during the photolithography process, thereby cutting down the power of the reflected beam. If desired, the bottom side of substrate 202 may also have an anti-reflection coating applied, so that most of the optical illumination (and laser, in the case where the laser is reflected off of the interconnect line) is reflected off the interconnect line, and not the bottom surface of substrate 202 having M-O film 203. Substrate 202, M-O film 203, dielectric mirror 204, and any anti-reflective coatings will be referred to collectivity herein as M-O crystal 206. Note that the laser beam passes through M-O crystal 206 twice. However, for the reflected beam, the value of both B and dz will be of opposite sign from the incident beam. Therefore, the rotation of both the incident and reflected beam will be in the same direction so that the amount of rotation will be twice that shown for angle 105 of FIG. 1, due to the two passes through M-O film 203. In the embodiments shown herein, typical amounts of rotation after two passes are in the milliradian range. The rotation is typically temperature dependent. For example, for a typical film, the Faraday rotation at 150° Celsius will be approximately 20–50% of the Faraday rotation at 40° Celsius. Due to the several different materials making up M-O crystal 206, there may be multiple reflections. For example, laser beam 210 may reflect at the interface between M-O film 203 and substrate 202. In such a case, the reflected beam will carry no rotation information. Such reflections, which have not been rotated in M-O film 203, will place a constant bias on the detectors to be described herein. However, it has been found that such reflections do not appear to alter the sensitivity of the measurements significantly. If possible, it is desirable to engineer M-O crystal 206 to minimize such reflections.

In one embodiment of the present invention substrate 202 is a Gadolinium Gallium Garnet (GGG) substrate, and M-O film 203 is a bismuth substituted iron garnet grown by liquid phase epitaxy (LPE) having the composition $(Tm_{2.14}Bi_{0.80}Pb_{0.07})(Fe_{3.13}Ga_{1.86})O_{12}$. The Curie temperature of this film is approximately 80° Celsius. In another embodiment of the present invention substrate 202 is a Large Lattice Constant (LLC) GGG substrate. The M-O film 203 grown on the LLC substrate is also a bismuth substituted iron garnet grown by LPE having the composition $(Bi_{1.09}Tm_{0.07}Gd_{0.95}Y_{0.90})(Fe_{3.91}Ga_{0.76}Y_{0.30}Tm_{0.02})O_{12}$ which has a Curie temperature of 170° Celsius. This crystal is more sensitive than the first material but is highly non-linear. In the third embodiment, a film having a composition of $Bi_{0.85}Lu_{2.15}Fe_5O_{12}$ is used as M-O film 203. This film has a relatively high Curie temperature. Other films include a $(BiLu)_3Fe_5O_{12}$ films grown on GGG substrates. Terbium Gallium Garnet (TGG) films have been tested but appear to have too low sensitivity for measuring the current in an interconnect line. In general, the thickness of the films in a currently preferred embodiment are in the range of 0.5–3 μm. The M-O films and substrates, including anti-reflection coating and dielectric mirror, may be obtained from the Airtron Division of Litton Industries. For more information, see the article entitled "Growth of Bismuth Garnet Films For High Figure Of Merit Faraday Effect Devices", SPIE vol. 753 —Acousto-Optic, Electro-Optic, and Magneto-Optic Devices and Applications, 1987.

It will be appreciated that numerous materials may be used as substrate 202 and M-O film 203, and that the present invention is not limited to the above-described embodiments. Several considerations are important in choosing the substrate 202 and the composition of M-O film 203, including the sensitivity and linearity of the film, referred to above. Another consideration is the Curie temperature of the film, above which it looses its magneto-optic properties. For example, a film with a low Curie temperature may limit the speed at which the device may be run in order to maintain the temperature below the Curie temperature. It has been found that the M-O films described herein, exhibit Faraday rotation properties at temperatures above the Curie temperature as measured on a polarizing microscope. Although this phenomena is not understood, it may be related to the fact that the present invention has a much greater sensitivity than a polarizing microscope. A further consideration in choosing the M-O film is that some M-O materials may exhibit a threshold magnetic field, below which no Faraday rotation is seen. If a material has such a threshold, then the threshold must be below the expected magnetic field from the lines to be measured in order for the crystal to be useful.

The choice of wavelength of laser beam 210 must be considered together with the properties of the M-O film 203, including sensitivity, transmittivity, and spatial resolution at the wavelength. For most of the films listed above, the sensitivity peaks in the range of approximately 500–550 μm. (For TGG films the sensitivity increases with decreasing wavelength). While small wavelength radiation such as ultraviolet radiation is desirable because it gives good spatial resolution, most materials, including the crystals described above, are opaque to ultraviolet radiation. Therefore, in a currently preferred embodiment incident laser beam 210 has a wavelength of approximately 514 nm. One drawback to using radiation in the visible spectrum (e.g., 514 nm is green) is that this component is separated from the radiation reaching the visual imaging system, so that the visual image of the device being tested may be degraded slightly.

Figure 3:
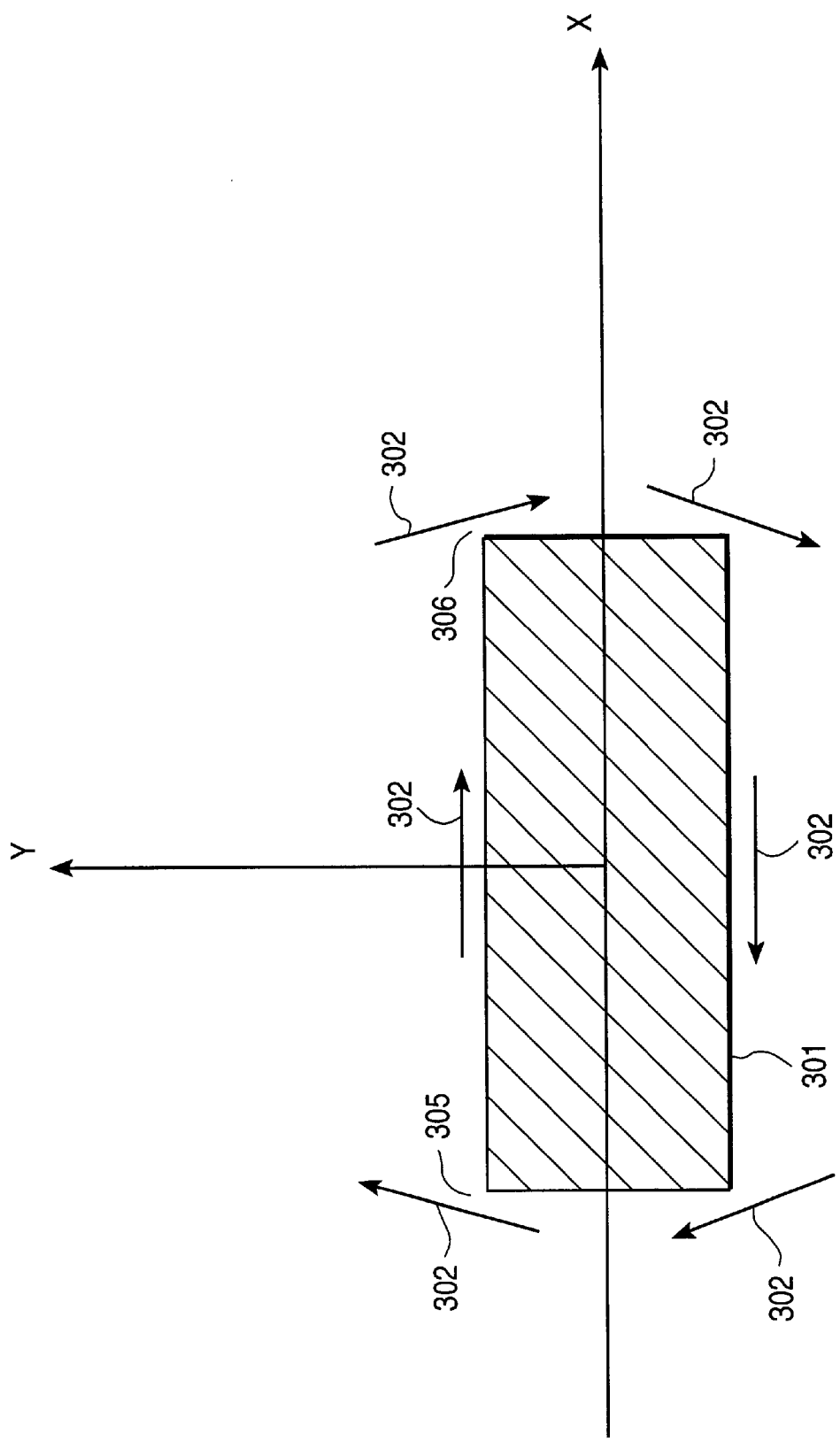
FIG. 3 illustrates the magnetic field surrounding an interconnect line.

FIG. 3 shows a cross-section of an interconnection line 301 which may be present on device 201. In FIG. 3, the y-axis is perpendicular to the plane of the device, and the direction of current flow is defined to be into the figure. Arrows 302 illustrate the magnitude and direction of the magnetic field around interconnection line 301. As can be seen from the Figure, the y component of the magnetic field is largest near the corners of the interconnection line 301, while the x component of the magnetic field is largest in the center of interconnection line 301. When measuring a device under test, it will be most practical to probe the current with the laser beam oriented perpendicular to the surface of the device under test. As described earlier, the rotation of the polarization is proportional to the component of the magnetic field parallel to the direction of the incoming light beam. Therefore, in a currently preferred embodiment, the laser beam is shined through the M-O crystal 206 near an edge of the interconnection line, so that it passes through the M-O crystal 206 where the y component of the magnetic field is at its greatest.

Figure 4:
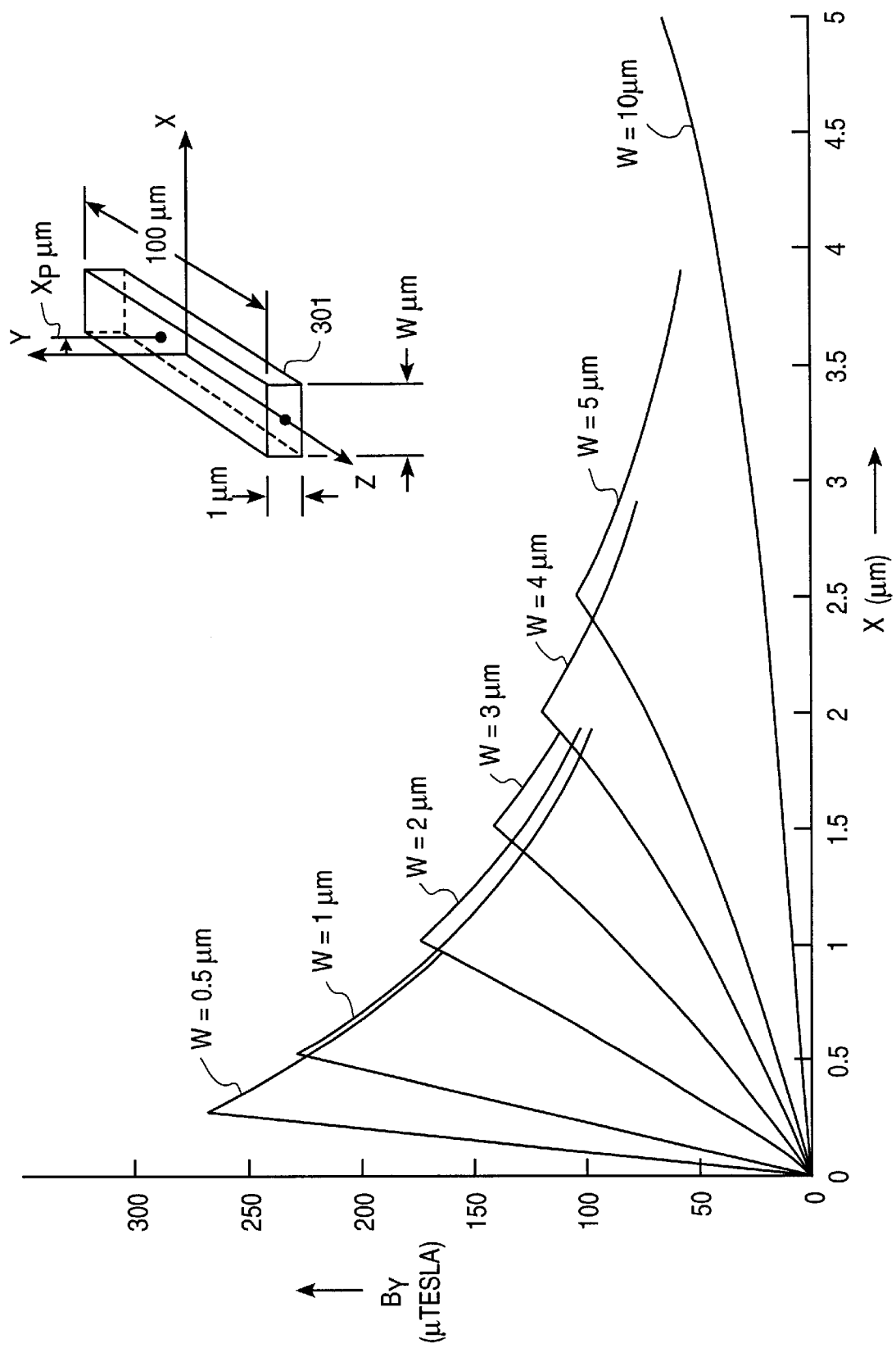
FIG. 4 illustrates the y component of the magnetic field as a function of distance in x for several interconnect lines of different widths.

FIG. 4 shows the calculated y component of the magnetic field for a current of 1 milliamp (mA) flowing through interconnection line 301 with a length along the z-axis of 100 microns, a thickness of 1 micron, and several different widths as shown. The graph shows the y component of the magnetic field, $B_y$, in microteslas ($\mu$Tesla) along one axis as a function of position in x along the other, for several different widths. The x and y direction are defined as shown in FIG. 4. The origin of the coordinate system is a point on the top of the interconnect line 301, at the center of the width and the length of the interconnect line 301. All calculations are for a y position of y=0. Note that for any given width, $B_y$ peaks at the edge of the interconnection line 301. For example, where the width, W, of interconnection line 301 is 4 microns, the peak in $B_y$ is about 120 $\mu$Tesla and occurs at x=2 microns. Similarly, for all other widths, the peak occurs at ½ the width, i.e., at the edge of the interconnection line 301, as described previously. As the length of the interconnection line 301 is increased from the 100 $\mu$ length used for the curves of FIG. 4, each curve retains approximately the same shape, with the peak at the same position along the x-axis, but with an increased magnitude of $B_y$ at all positions.

Figure 5:
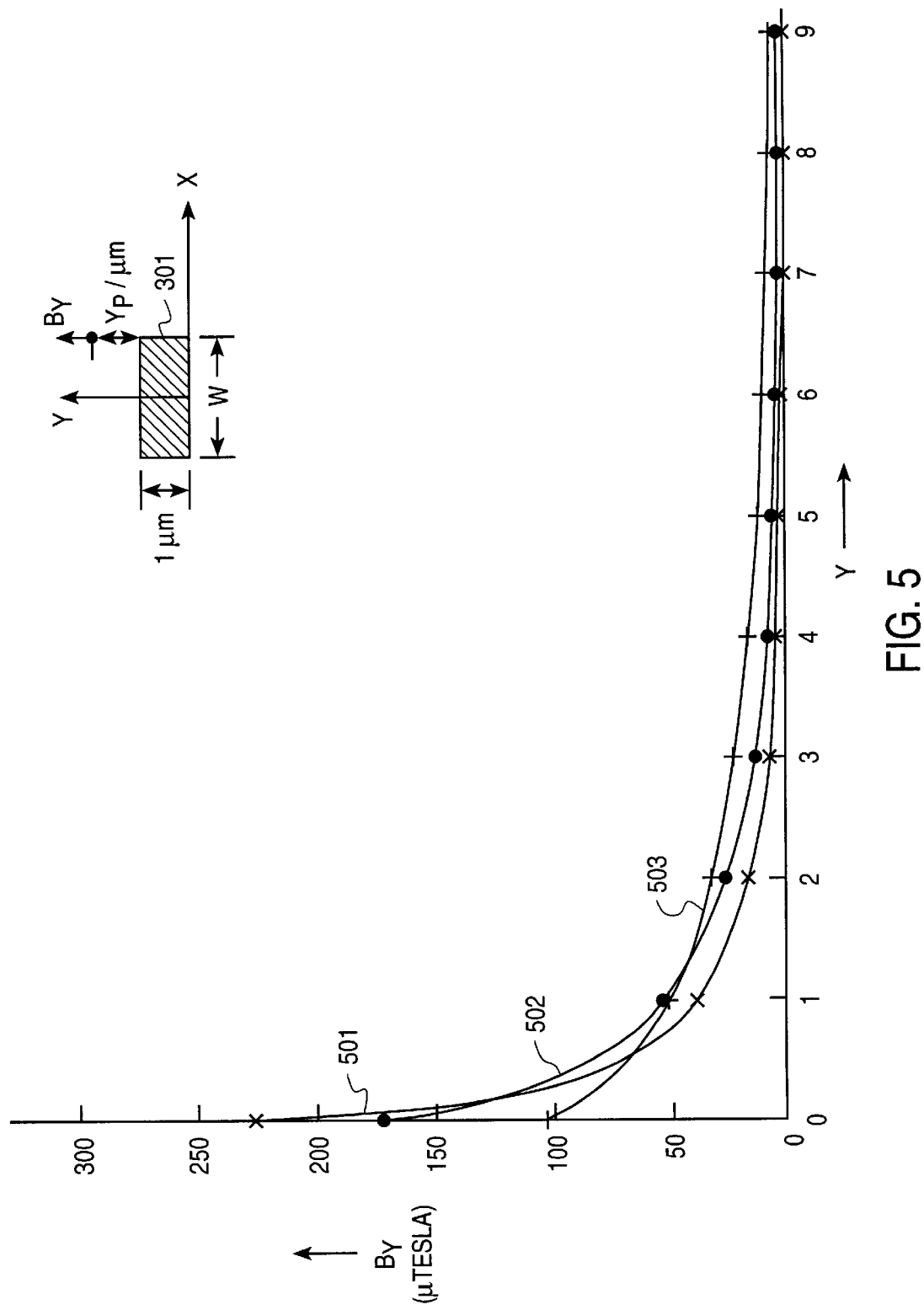
FIG. 5 shows a graph of a variation of the peak value of the y component of the magnetic field as a function of distance above the interconnect line, for several different widths.

FIG. 5 shows the variation in the peak value of $B_y$ (i.e., the value of $B_y$ at the edge of interconnect line 301) with distance above interconnect line 301. The curves shown in FIG. 5 are calculated for an interconnect line 301 having a length of 100 $\mu$m and a height of 1 $\mu$m, for a current of 1 mA. Curve 501 shows $B_y$ as a function of position in y for a width of one micron, curve 502 shows $B_y$ as a function of y for a width of 2 microns, and curve 503 shows $B_y$ as a function of position in y for a width of 5 microns. As can be seen from the graph, $B_y$ drops off significantly with distance above the interconnection line. Further, the decrease in peak value with increasing distance above the line is most pronounced for narrow lines. Thus with these considerations mind, it is desirable to place the M-O crystal 206 at the edge of an interconnection line at a level close to the surface of the line. The curves of FIG. 5 were generated using the formulae derived from the Biot-Savart law as described in the section entitled "Magnetic Field Calculation". For the conditions given for the interconnect line 301 of FIG. 5, the data can be fitted to an approximate analytical formula as given by:

$$B_y = B_{yo} e^{-\frac{(1.54y)}{w}} \quad 6)$$

Where y is the position in y above the edge of the interconnect line, w is the width of the interconnect line 301, and $B_{yo}$ is the peak value of $B_y$ (i.e., the value of $B_y$ at y=0, which is at the upper right corner of the interconnect line 301 in FIG. 5). In the present invention, the magnetic field data is integrated from approximately y=0.7–0.8 $\mu$m to y=t, where t is the thickness of the M-O film. The starting value of y arises because the combined thickness of dielectric mirror 204 and a passivation layer on the surface of the interconnect line causes the bottom of M-O film 203 to be about this distance above the surface of the line. In the present invention, dielectric mirror 204 is approximately 0.6–0.7 $\mu$m thick, and the dielectric layer is approximately 0.1 $\mu$m. Although dielectric layers on the finished device are typically much thicker than this, in the present invention, any passivation layer is etched until only approximately 1000 Å of passivation remains over the interconnect line. This 1000 Å is left so that the interconnect line is not damaged by contact with the M-O crystal.

Figure 6:
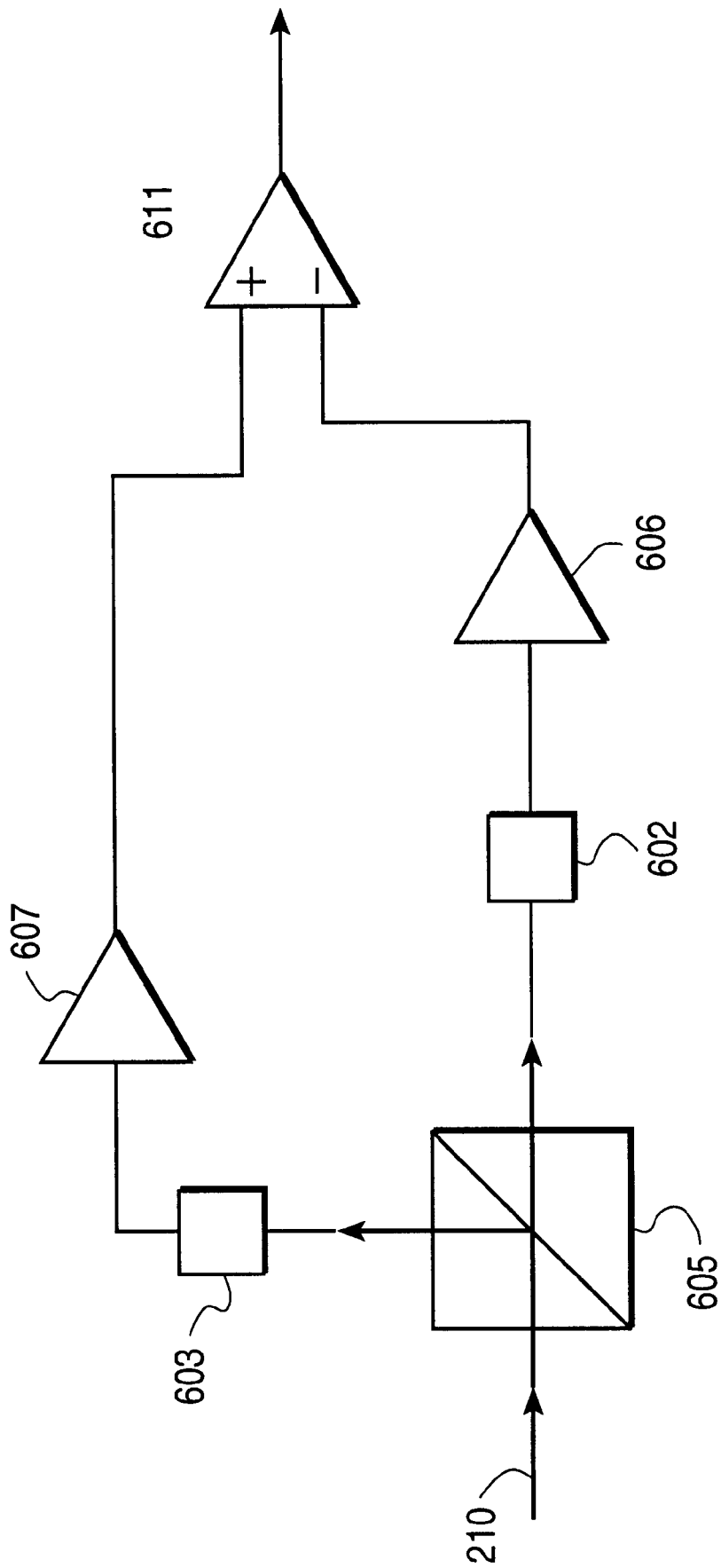
FIG. 6 shows a schematic diagram of the detector used in the laser current probe of the present invention.

FIG. 6 shows a schematic diagram of the detector used in the present invention. As will be discussed more fully below, in a currently preferred embodiment the laser beam 210, after being reflected off of interconnect line 301 near the edge, and after passing through M-O crystal 206 twice—once before and once after reflection from the device under test—is first passed through polarizing prism 605. In a currently preferred embodiment, polarizing prism 605 is a Glan-Thompson polarizing prism which has an extinction ratio of less than $5 \times 10^{-5}$, which is a measure of the accuracy with which the prism splits the polarized beam into its orthogonal components. The split x polarized and y polarized components are reflected from polarizing prism 605 at a predetermined angle from one another, for example, 60° for a currently preferred embodiment. As will be shown in FIG. 11, photodiodes 602 and 603 are positioned at an angle of 60° with respect to each other such that photodiode 602 detects the y component of the polarization, while photodiode 603 detects the x component of the polarization. As will be described more fully below, the polarization of incoming beam 210 is rotated prior to prism 605, such that the x and y components of the polarization are equal when no current is passed through interconnect line 301. The photodiodes 602 and 603 produce a signal proportional to the energy of the y an x polarized components of the laser beam 210, respectively. The signals from each of the photodiodes 602 and 603 are first sent through pre-amplifiers 606 and 607, and are then combined in differential amplifier 611, the output of which is then sent to an oscilloscope. Since the x and y components of the polarization are equal when no current is flowing through the line, the output of differential amplifier 611 will be zero when there is no current. However, when current is flowing through the interconnect line, the polarization of incoming beam 210 will be different from the zero current polarization, so the x and y components will no longer be the same as one another. Thus, the difference in the output of the photo diodes 602 and 603 will likewise be other than zero, and the output of differential amplifier 611 will have a value that is proportional to the current through interconnect line 301.

Figure 7:
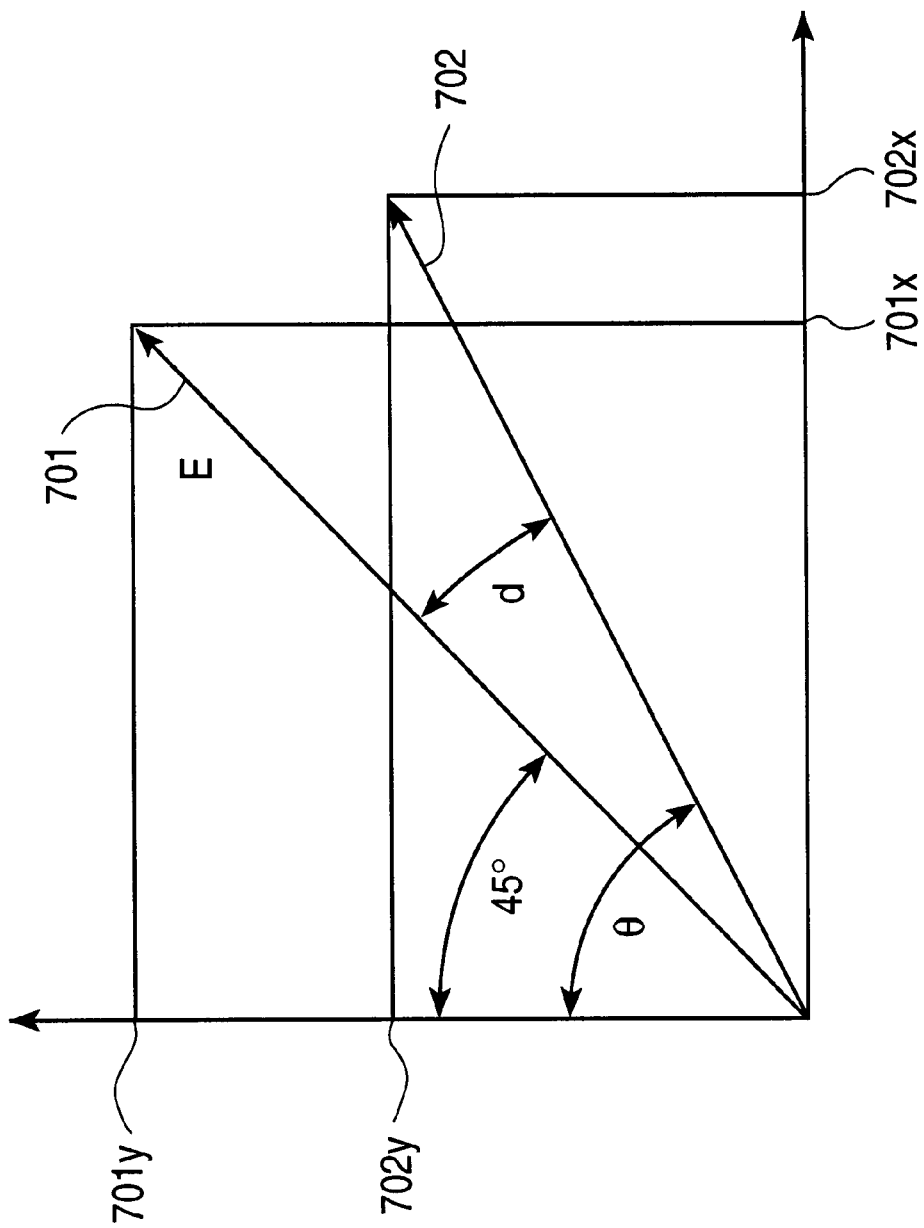
FIG. 7 illustrates the calculation of the angle of rotation of the polarization.

FIG. 7 illustrates the manner in which the power out of differential amplifier 611 is used to determine the angle of rotation, θ. Vector 701 represents the electric field vector during the zero current situation described above. If this vector has a magnitude E, both the x component 701x and the y component 701y will be equal to E/√2. Vector 702 represents the E field after a rotation of θ such that vector 701 and 702 have an angle d between them. In this case the x component 702x of the electric field vector 702 is given by:

$$\frac{E}{\sqrt{2}}(\cos d + \sin d) \qquad 3)$$

The y component 702y of the electric field vector 702 is given by:

$$\frac{E}{\sqrt{2}}(\cos d - \sin d) \qquad 4)$$

The power out of the photodiodes 602 and 603 ($P_{602}$ and $P_{603}$) is proportional to the square of the x and y components, respectively, of the E field vector 702:

$$P_{602} \propto \frac{E^2}{2}(\cos d - \sin d)^2 = \frac{E^2}{2}(1 - \sin 2d) \qquad 5)$$

$$P_{603} \propto \frac{E^2}{2}(\cos d + \sin d)^2 = \frac{E^2}{2}(1 + \sin 2d) \qquad 6)$$

Therefore, when incoming laser beam 210 has passed through M-O crystal 206 while a current is flowing through the interconnection line being probed, so that the E field vector is rotated by an angle d, the power out of differential amplifier 611, $P_{602} - P_{603}$, is proportional to:

7) $P_{602} - P_{603}$ $E^2 \sin 2d \approx E^2 2d$

From equation (7), it can be seen that for small angles, the power out is directly proportional to the rotation. As described earlier, the rotation through M-O crystal 206 is doubled due to the fact the laser beam passes through the M-O crystal 206 twice. Therefore, the angle d shown in FIG. 7 and calculated above is 2 times the angle θ shown in FIG. 1. As described earlier, the rotation caused by the magnetic field due to the current in the interconnect line is compared with the rotation caused by the known magnetic field from a solenoid in a currently preferred embodiment, so that the current through the interconnect line can be determined without having to determine the exact relationship between the output of the differential amplifier 611 and the rotation. The comparison of the rotation caused by the current through interconnect line and that caused by the magnetic field of the solenoid is described in conjunction with FIGS. 13A–13D.

Figure 8A:
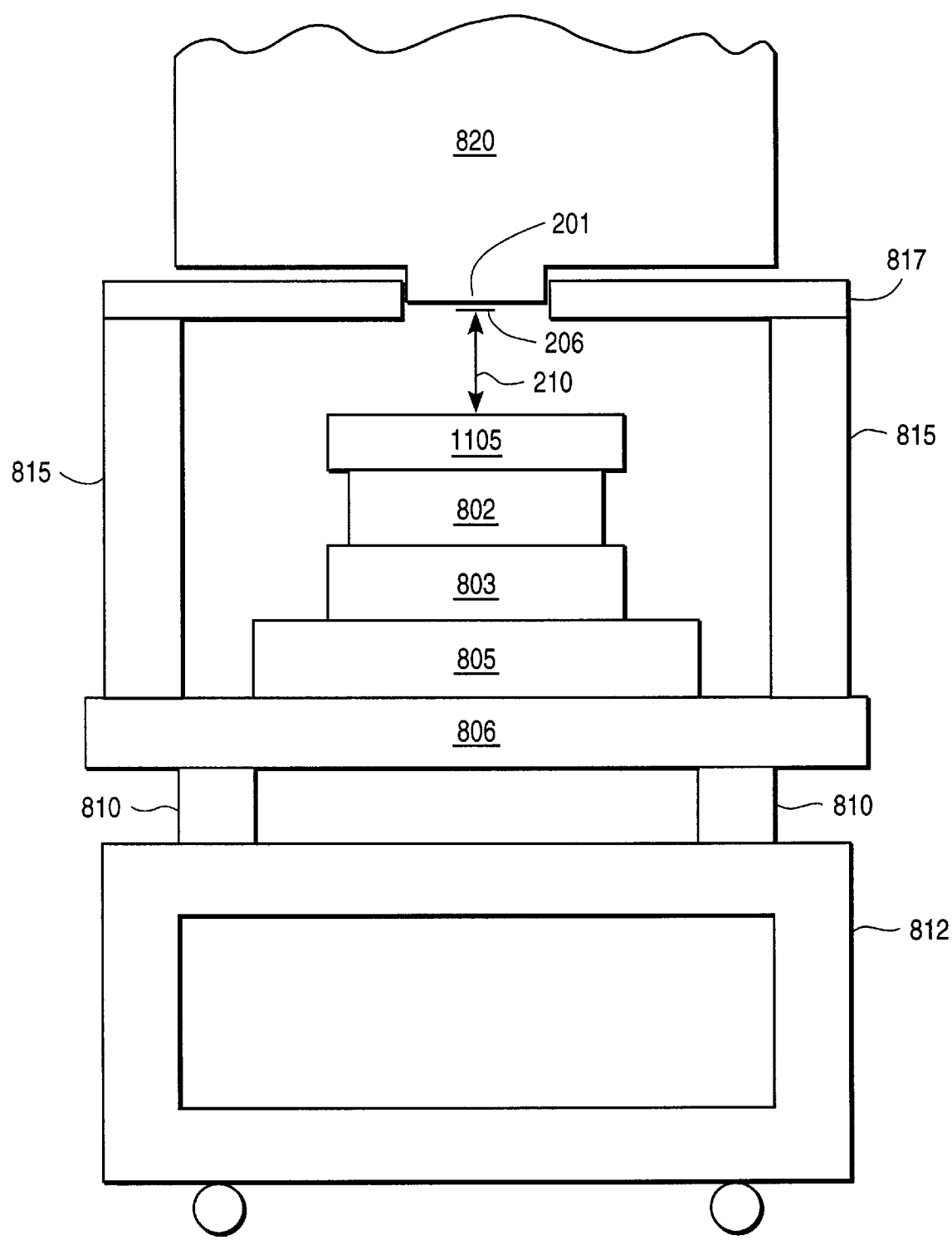
FIGS. 8A and 8B show a schematic illustration of the laser probe system of the present invention.
Figure 8B:
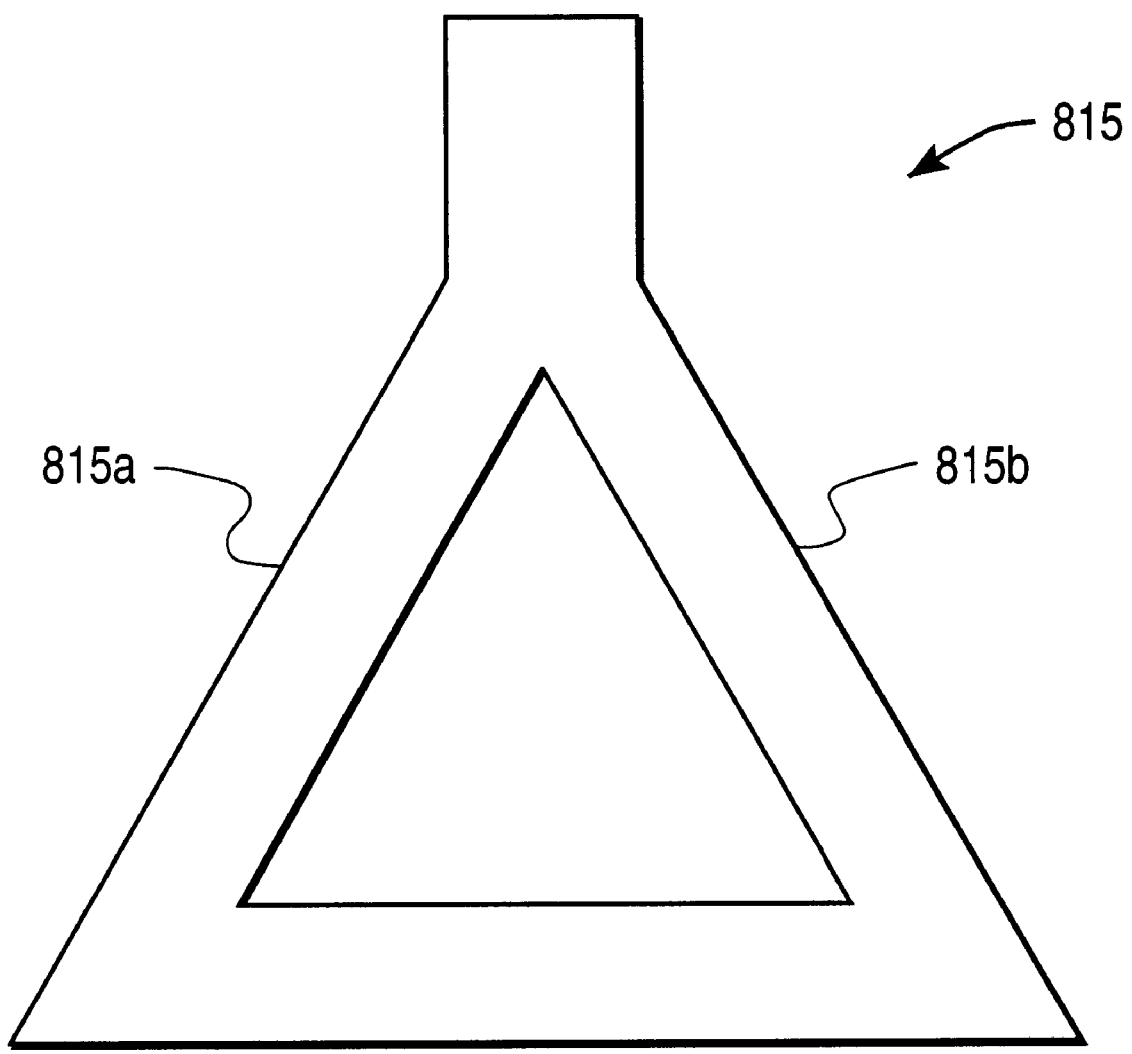

FIG. 8 shows a schematic illustration of the probe system 800 of the present invention. Optical board 1105 rests upon y stage 802 and x stage 803. Y stage 802 and x stage 803 are precision, voice coil motor driven positioning stages whose positions are determined with laser interferometers in a closed loop arrangement, which allow the optical board 1105 to be positioned in x and y with a precision of approximately ±0.1 μm. The stages 802 and 803 rest upon granite slab 805 having the dimensions of approximately 2'×3'×3", which in turn sits upon aluminum platform 806.

The granite slab 805 serves to reduce vibrations and other unwanted motion to allow for precise positioning. Furthermore, aluminum platform 806 sits upon 4 shock absorbing members 810, which are attached to frame 812. Frame 812 further comprises legs (not shown) in addition to the wheels shown in the Figure to hold the system 800 in place during use. Legs 815 support platform 817, which has a circular opening to allow for direct docking of device tester 820. In a currently preferred embodiment, an Integrated Measurement Systems (IMS) tester is used to run test patterns on the device under test. This tester has a circular load board into which the packaged device under test is inserted for the test patterns to be run. In the present invention, the IMS tester is placed in a frame which allows for the tester to be lifted and rotated upside down above the position of platform 817 in FIG. 8A, so that the load board mates into the circular opening in platform 817. Thus, device tester 820 is positioned upside down compared with the normal mode of operation when this system is used, for example, to test devices which are to be packaged. This arrangement has been found to be advantageous over alternative arrangements where the device is placed on the positioning stage, since this latter arrangement would required numerous cables to be coupled to the load board when it is placed upon the positioning stages. This latter arrangement suffers from the disadvantage that the frequency at which the device may be tested is limited by the presence of cables between the load board and the tester. Additionally, the cables coupling the board to the tester have been found to hamper the precision positioning stage. Referring again to FIG. 8A, laser beam 210 emanates from optical board 1105, through M-O crystal 206, reflects off of the interconnect line, and then back again through M-O crystal 206 to optical board 1105.

As described above, the probe system 800 includes granite slab 805 and shock absorbing members 810 to reduce vibrations and other movement to allow for precise positioning of the laser beam. Additionally, the legs 815 of the currently preferred embodiment reduce vibrations which may be transmitted from the tester 820 to other portions of the system. Briefly referring to FIG. 8B, it can be seen that legs 815 have an inverted Y shape with 2 portions 815a and 815b near the base where leg 815 is attached to aluminum platform 806. It has been found that this structure greatly reduces vibrations which may be transmitted by the tester 820 by serving to dampen higher frequency vibration. The individual legs 815a and 815b are separated by a distance of approximately 6"–15" near the base. The vertical distance of the split portions 815a and 815b of leg 815 is approximately 12"–24" and the remaining length of the single segment of leg 815 is approximately 6"–12". In a currently preferred embodiment, 3 legs 815 are used to hold platform 817 above optical board 1105. In a currently preferred embodiment, the mechanical portions of system 800 are designed by Teletrac Corporation. It has been found using the embodiment illustrated in FIGS. 8A and 8B, and using a tester 820 having well balanced fans, movement of the laser beam relative to the device under test due to vibration can be kept to less than 0.1 μm.

Figure 9:
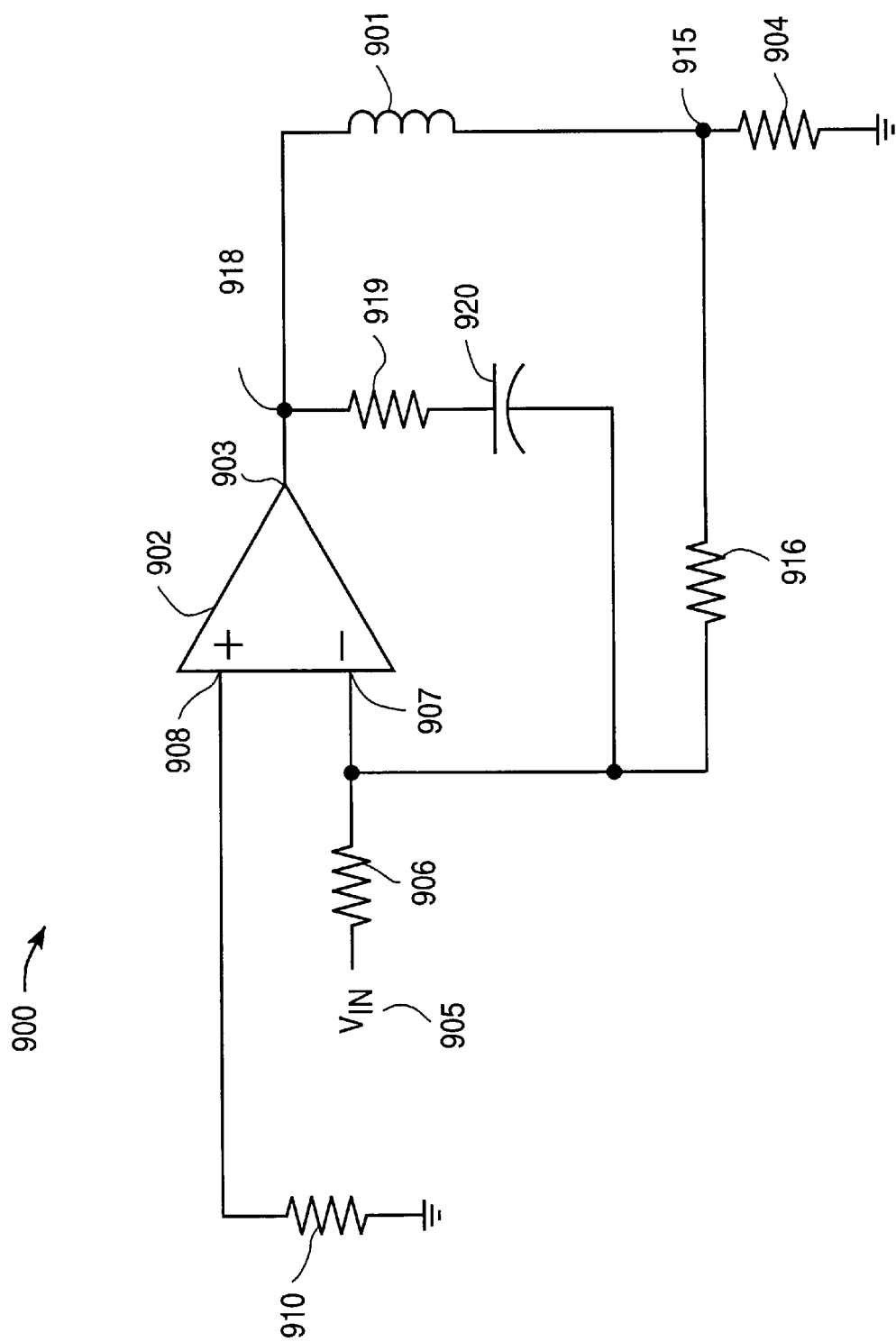
FIG. 9 shows the solenoid circuit used in the present invention.

As mentioned earlier, in the present invention a solenoid is used so that the current can be determined without knowing the Verdet constant V of M-O film 203. As described above, a ratio of the measured rotation of the solenoid to that of the chip can be made to determine the current in the chip. In a preferred embodiment of the present invention, the field of the solenoid is varied so that the measured rotation of the solenoid is of approximately the same magnitude as the measured rotation of the chip. Making the magnitude of the solenoid's rotation approximately the same as that of the chip is advantageous since it eliminates any non-linearity of the Verdet constant as a function of the magnetic field. Additionally, since the solenoid and chip signals are of approximately the same magnitude, and are carried out simultaneously, other sources of variation, such as non-uniformity of the M-O film, contamination of the film, tilt of the film with respect to laser beam 210, etc. are compensated for by use of the solenoid. As will be seen, the solenoid may be driven at relatively high frequencies. Referring to FIG. 9, circuit 900, used to drive solenoid 901 is shown. In a currently preferred embodiment operational amplifier (op-amp) 902 drives solenoid 901, which has an inductance of approximately 1.5 mH. As shown, an input voltage Vin 905 is coupled through resistor 906, which in a currently preferred embodiment has a resistance of approximately 10 KΩ, to input 907 of op-amp 902. The output 903 of op-amp 902 is coupled to solenoid 901, which is then coupled to ground via resistor 904, which in a currently preferred embodiment has a resistance of approximately 1 Ω. Input 908 of op-amp 902 is coupled to ground via resistor 910 which in a currently preferred embodiment has a resistance of approximately 900 Ω. As shown, the output 903 of op-amp 902 is fed back to input 907 through resistor 919 and capacitor 920 coupled in series. In a currently preferred embodiment, resistor 919 has a resistance of approximately 51 Ω, and capacitor 920 has a capacitance of approximately 1 $\mu$F. Also as shown in FIG. 9, node 915 is coupled to input 907 through resistor 916, which has a resistance of approximately 1 KΩ in a currently preferred embodiment.

Figure 10A:
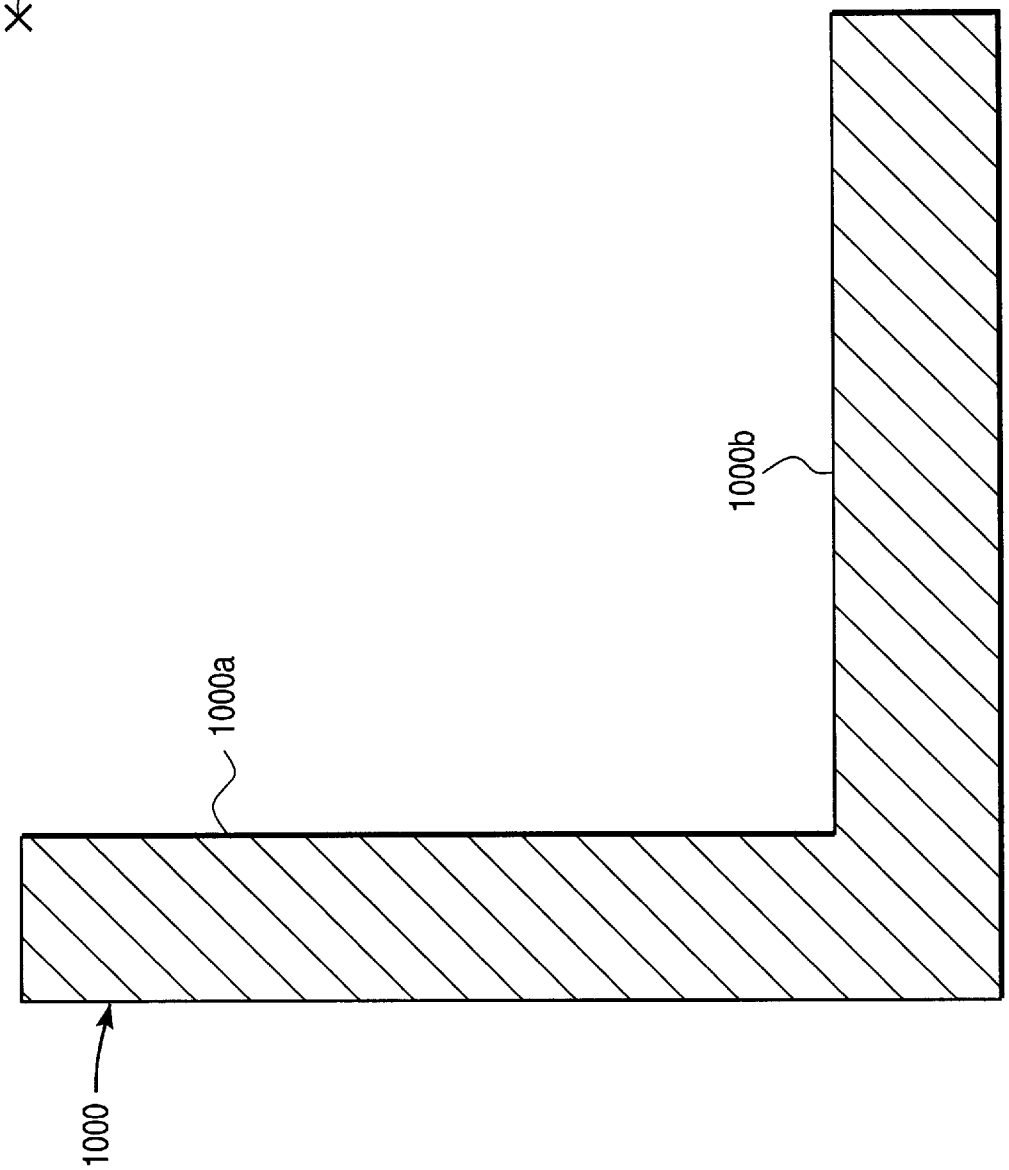
FIG. 10A shows one embodiment of a magneto-optic crystal holder.

FIG. 10A illustrates holder 1000, which is used to hold M-O crystal 206. In a currently preferred embodiment, each leg 1000a and 1000b of crystal holder 1000 is approximately 5 mm in length. M-O crystal 206 is attached to the surface of crystal holder 1000 shown cross-hatched in FIG. 10A. The portion of crystal 203 may be square or rectangular, and may be greater or less than the dimension of holder 1000. The exact size and dimensions of crystal holder 1000 may be varied depending upon use. The design of crystal holder 1000, allows for probing near the very edges of a die. For example, if a closed frame type structure were used, then the laser probe could get no nearer to the edge of a die than the width of the frame. However, in a currently preferred embodiment, crystal holder 1000 may be positioned such that the location marked x is directly underneath an interconnection line near the edge of a die. The laser beam of the present invention may then be shone through this portion of M-O crystal 206. In this way, probing of interconnection lines at any location on the die is possible. System 800 of FIG. 8 may comprise a positioning device to hold crystal holder 1000 in place during probing. Typically, the positioning device may be coupled to a component on the optical board 1105. The positioning means may allow for rotation about the point where legs 1000a and 1000b meet, to allow rotation of holder 1000 to allow for probing in all corners of the device under test.

Figure 10B:
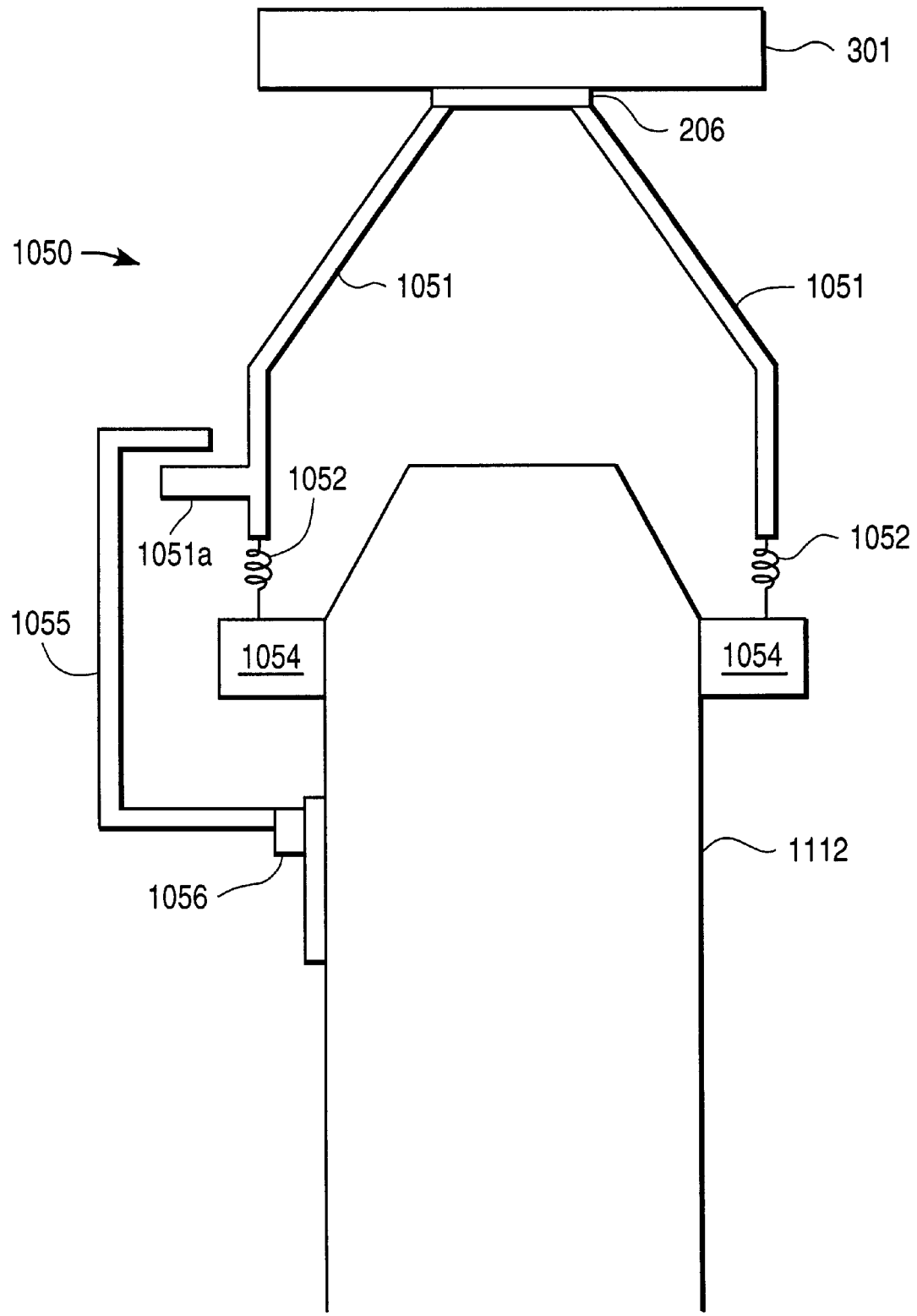
FIG. 10B shows a further embodiment of a magneto-optic crystal holder.

One problem with regard to holding M-O crystal 206 near the device under test, is that the physical space around the device under test in system 800 is very small. Therefore, the above described positioning device which allows for movement of the M-O crystal 206 may be costly and complex. An alternative method that may be used, is a simple holding clip, which places an M-O crystal 206 of approximately the same size as the chip against the chip's surface. One drawback of this method is that there may be many different devices of different sizes to be tested, thereby requiring an M-O crystal for each different type of device. FIG. 10B shows a schematic illustration of crystal holder 1050. As shown, legs 1051 are coupled to M-O crystal 206. M-O crystal 206 may be held on, for example, a holder such as holder 1000 or, alternatively a closed frame type holder. Alternatively, M-O crystal 206 may be affixed directly to legs 1051. As shown, holder 1050 is coupled to objective lens 1112, which, as will be described in conjunction with FIG. 11 focuses the laser beam through M-O crystal 206. The holder 1050 is affixed to objective lens 1112 via standoffs 1054 which are coupled to legs 1051 via springs 1052. In FIG. 10B, holder 1050 is shown in the up position, with the legs 1051 holding M-O crystal 206 against device under test 201 by the force of springs 1052. As shown, arm 1055 is disposed with a portion above section 1051a of leg 1051 such that when arm 1055 is moved in a downward direction via actuator 1056, arm 1055 engages section 1051a to disengage M-O crystal 206 from substrate 201. In this way, when arm 1055 is in the down position (not shown), M-O crystal is disposed slightly below device under test 201, so that objective lens 1112 can be positioned under the portion of device 201 of interest and brought into focus. Once the desired interconnect line is in focus, actuator 1056 raises arm 1055 until M-O crystal is in contact with device 201 under the force of springs 1055 as shown in FIG. 10B. Next, when it is desired to move to a different location, arm 1055 disengages crystal 206 from device under test 201 as described above, to allow for movement of the laser probe to another location on device under test 201.

Figure 11:
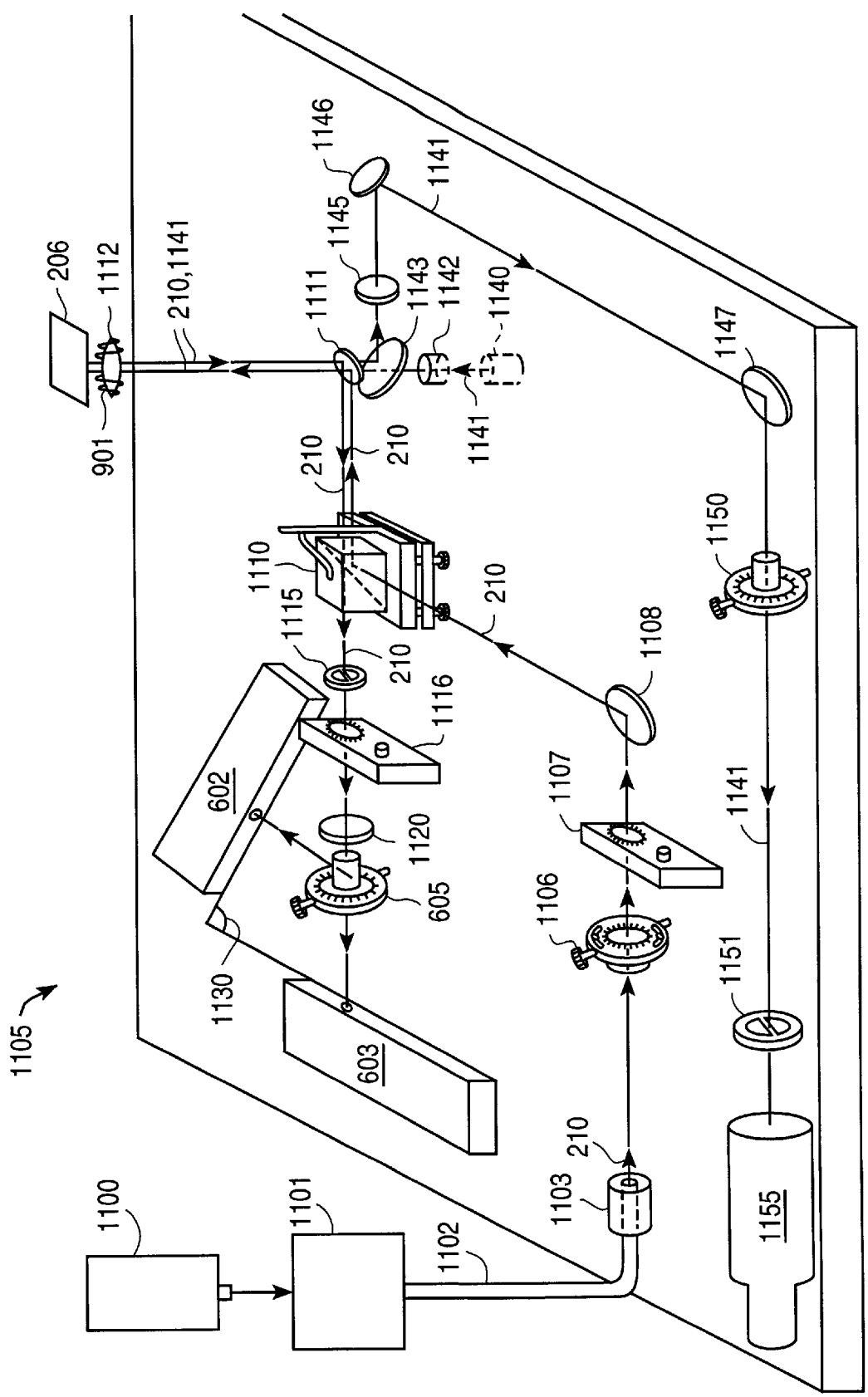
FIG. 11 shows the optical board of the present invention.

FIG. 11 shows a schematic diagram of the optical system of the present invention. The laser beam is generated by laser 1100, which in a current embodiment has a wavelength of 514 nm and a power output of 100 milliwatts. In a currently preferred embodiment, the laser is an argon ion laser manufactured by Ion Laser Technology. Laser 1100 comprises a fiber coupler to deliver polarized light. The efficiency of the coupler is in the range of approximately 50–80%, with the lower efficiency occurring at full power. For ease of discussion, the path of the laser beam is denoted by reference numeral 210 throughout the system described herein. However, it will be understood that due to the various optical components described herein, such as polarizers, etc. laser beam 210 will have different characteristics, depending upon the optical elements through which it is passed. For example, laser beam 210 may have different polarizations at different points in its pathway, and will typically have a different power at different points.

Laser beam 210 exiting laser 1100 enters Bragg cell 1101. Bragg cell 1101 allows for stroboscopic measurement, by turning the laser beam on and off very quickly. In a currently preferred embodiment the resolution of Bragg cell 1101 is in the range of approximately 2–5 nanoseconds (ns). Other methods of turning the laser beam on and off may be used. For example, the Faraday rotation effect may be used as a "magnetic shutter" by directing the laser beam through two polarizers having an M-O material within a solenoid between them. In the on condition, the polarization of the laser beam is adjusted such that it is aligned with the exit polarizer. In the off condition, the polarization of the beam is adjusted such that it is at an angle of 90° to the exit polarizer. The solenoid is used to create a magnetic field sufficient to cause a 90° rotation of the polarization of the beam, in response to signals sent to the solenoid. As another alternative, an "electrical shutter" comprising a Pockles cell placed between two polarizers may be used. Similar to the above described magnetic shutter, the Pockles cell adjusts the polarization of the beam such that it is aligned with the exit polarizer in the on condition, and at an angle of 90° to the exit polarizer in the off condition. As a further alternative, a high frequency mode lock laser may be used. One drawback to this approach is that the frequency of pulses cannot be changed so that it is difficult to synchronize the laser with the chip.

Referring again to FIG. 11, the laser beam exiting Bragg cell 1101 is brought onto optical board 1105 via fiber optic cable 1102. It is important that the polarization of beam 201 does not change during measurement due to, for example, movement of, or stress to, fiber optic cable 1102. Therefore, in a currently preferred embodiment, fiber optic cable 1102 is a single mode fiber having a casing or cladding which provides lateral stress relief, so that the polarization itself, and direction of polarization, is maintained in fiber optic cable 1102. In a currently preferred embodiment, fiber optic cable 1102, also known as a polarization preserving fiber, is obtained from OZ Optics. Alternatively, mirrors may be used in place of fiber optic cable 1102 to bring laser beam 210 onto optical board 1105. The laser beam first passes through collimator 1103, which collimates the beam. Next, laser beam 210 passes through polarizer 1106 which is oriented in the same direction as the polarization of the beam 210 exiting collimator 1103. Next, the beam 210 passes through half wave plate 1107. Half wave plate 1107 is used to adjust the polarization of the beam 210. The extinction ratio of M-O film 203 is dependent upon the angle of polarization of the incoming laser beam 210. Therefore, half wave plate 1107 can be used to adjust the polarization of beam 210 to improve the extinction ratio of the M-O film 203. Next, the beam is reflected off of mirror 1108 toward beam splitter 1110. In a currently preferred embodiment, mirror 1108 is a dielectric mirror. As is well known, such a mirror reflects light using interference effects and is tuned to the wavelength of light to be reflected. Although, a reflective metal type mirror could be used, such mirrors typically result in power loss and may become burned away with time. Beam splitter 1110 reflects the incoming beam to dichroic mirror 1111, which is designed to reflect the wavelength of laser beam 210 and transmit the remainder of the visible spectrum. Dichroic mirror 1111 therefore reflects the beam 210 through objective lens 1112 and then through M-O crystal 206, which is placed directly below the device under test, as described previously. The device under test is not shown in FIG. 11. Beam 210 is reflected off of dielectric mirror 204, back through M-O film 203 and objective lens 1112 to dichroic mirror 1111. Dichroic mirror 1111 then reflects beam 210 back through beam splitter 1110 as shown. As shown schematically in FIG. 11, solenoid 901 is disposed around objective lens 1112. In this way, the solenoid 901 always maintains the same positional relationship with respect to the portion of M-O crystal 206 through which beam 210 is passing. In one embodiment, solenoid 901 is positioned such that the laser beam 210 passes along the axis of the solenoid so that only a y component of the field exists along the path of laser beam 210. In an alternative embodiment, solenoid 901 is positioned slightly off center, so that there is a slight lateral component of the field within the M-O film 203. This lateral field serves to saturate M-O film 203 to some extent, which improves the sensitivity of some classes of M-O films.

After reflection from dichroic mirror 1111, laser beam 210 exiting beam splitter 1110 next passes through aperture 1115 and then through half wave plate 1116. The beam 210 then passes through bi-convex lens 1120 and into polarizing prism 605. From there, the beam is split into its x and y components which are sent to photodetectors 602, and 603, as described in conjunction with FIG. 6. As shown by angle 1130, the photodetectors are positioned at an angle of 60° with respect to one another, since the x and y components of the beam exit polarizing prism 605 at this angle. The half wave plate 1116 is used to rotate the polarization so that the orientation of the incoming laser beam 210 can be varied prior to the detection by the photodiodes 602 and 603. This is done so that the x and y signals can be set to be equal when no current is flowing through the interconnection line. Note that any misalignment of the components or change in positioning of the device under test may slightly change the path of laser beam 210. This could lead to spurious changes in the x and y components of the beam depending upon where the beam strikes polarizing prism 605, such that photodetector 602 receives, for example, only 90% of its component of the beam, while, for example, photodetector 603 receives 100% of its component of the beam. This is prevented in the present invention by the placement of aperture 1115 prior to lens 1120. Aperture 1115 is narrower than the width of beam 210, so that lens 1120 always focuses the image of the aperture 1115 onto polarizing prism 605. Therefore, even if there is some misalignment in the components, polarizing prism 605 will always receive the image of the aperture and photodetectors 602 and 603 will always receive their respective orthogonal component of the same image. Thus, a misalignment in any components will not cause an extraneous change in the relative strength of the x and y signals. Rather, if the components are misaligned off center, the power of the signal will be reduced in equal proportion.

The optical imaging system of the present invention, which is used to position beam 210 at the edge of the interconnect line to be probed, is also shown in FIG. 11. Illuminator 1140 which is below the optical board 1100 shines beam 1141 though opening 1142, through beam splitter 1143 and dichroic mirror 1111 and illuminates the device under test (not shown). Beam 1141 is reflected back through dichroic mirror 1111, reflected off of beam splitter 1143, though convex lens 1145, then off of metal mirror 1146, pentaprism 1147, through polarizer 1150 and aperture 1151 into CCD camera 1155. As described earlier, dichroic mirror 1111 is tuned to the wavelength used for the laser beam. Therefore, radiation from a small part of the green portion of the spectrum is missing from the return beam.

Measurement of the current through an interconnect line will now be described. In one embodiment of the present invention, the measurements are made in real-time, and the signals produced by the Faraday rotation are described as they appear on an oscilloscope screen, for example. In further embodiments of the present invention, methods of performing stroboscopic measurements will be described. In both types of measurements, the chip is cycled through a test sequence, and at some point in that sequence a reference zero is produced by stopping the chip clock. Additionally, in both types of measurements a comparison is made between the chip signal and the signal produced by the solenoid 901, as will be discussed in conjunction with each method.

During test, the chip is cycled through a predetermined loop of instructions, as is well known. The loop has a repetition rate in the approximate range of 10–100 kilohertz, with a reset at some point during the cycle. In the present invention, the chip clock is momentarily stopped (also referred to as "chopped" or "frozen") to determine a zero current reference signal. For example, in one embodiment, the clock is stopped for 20 microseconds ($\mu$s) after each reset signal. As is well known, in CMOS and BiCMOS type devices the current through the interconnect lines is negligible, and may be assumed to be zero, when the clock is frozen. In a currently preferred embodiment, the chopping is achieved by by-passing the phase-lock loop of the device under test and appropriately programming the vector sequence to the clock pin from the IMS tester.

Figure 12:
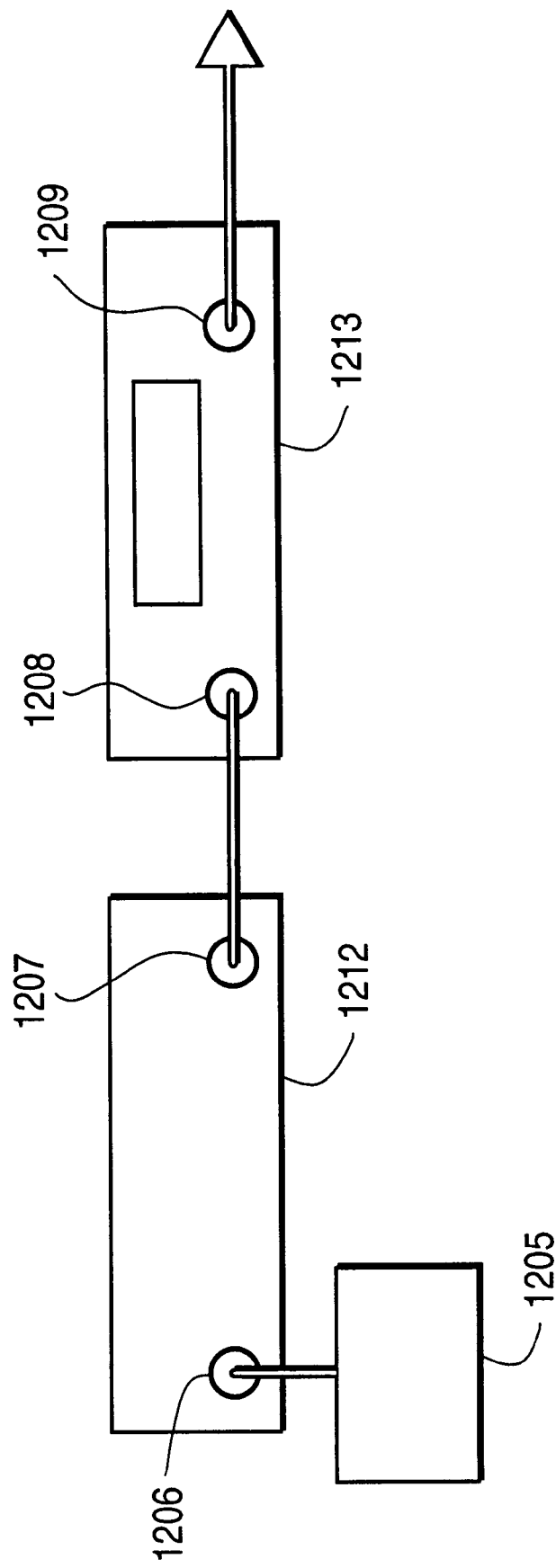
FIG. 12 shows a schematic illustration of a solenoid timing system for real-time measurement.

As mentioned above, in the present invention, a solenoid is used to generate a magnetic field of known magnitude as a method of determining the current through the interconnect line by use of the ratio of the measured signals, as shown, in equations (4) and (5). For the real-time measurements, a signal is produced at a frequency of $\frac{1}{2^n}$ of the loop repetition rate, as will be seen in FIGS. 13A and 13B. The generation of the signal to drive the solenoid circuit 900 of FIG. 9 for real-time measurement is shown in FIG. 12. As shown, the output trigger of the IMS tester, shown as block 1205, is coupled to the input 1206 of frequency counter 1212. The frequency counter 1212 then produces a square wave at, for example, $\frac{1}{32}$ of the input frequency at output 1207, which is used to trigger function generator 1213, which produces a pulse of variable width. As shown in FIG. 12A, output signal 1207 is coupled to input 1208 of HP 1116A function generator 1213. The output signal 1209 of function generator 1213 is set to produce a square wave, which, in a currently preferred embodiment has a pulse width of 2.70 milliseconds (ms), providing an approximately 50% duty cycle. Output 1209 is coupled to the solenoid circuit 900 to produce the synchronized solenoid field. While the present invention has been illustrated with the use of a solenoid at $\frac{1}{32}$ the frequency of the loop repetition rate, it will be understood that other frequencies may be used. It may be desirable to use, for example, a solenoid frequency of $\frac{1}{2}$ the loop repetition rate to reduce the effect, if any, of frequency on the Faraday rotation.

Figure 13A:
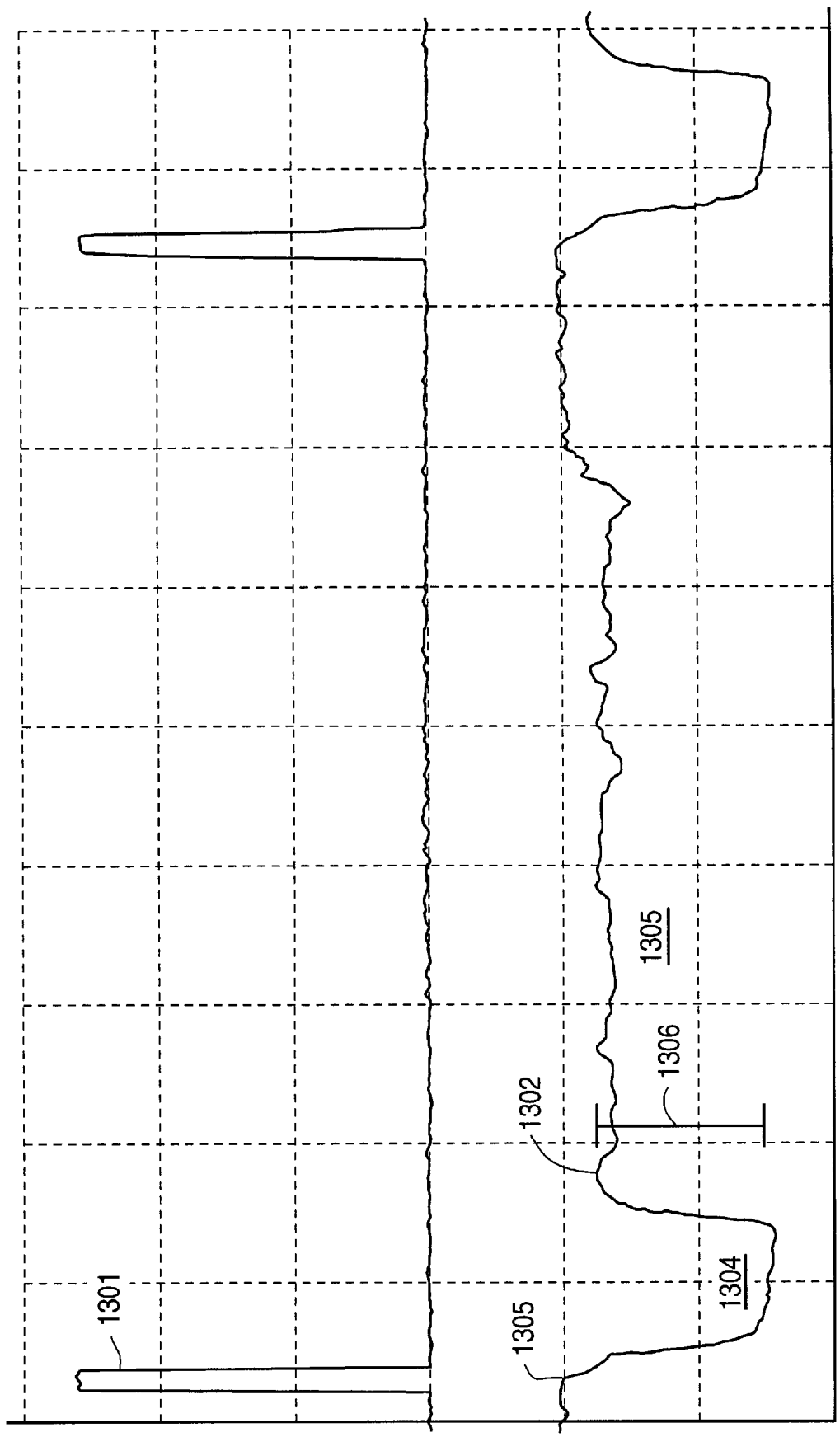
FIGS. 13A shows the chip reset signal and a real-time measurement from an interconnect line.
Figure 13B:
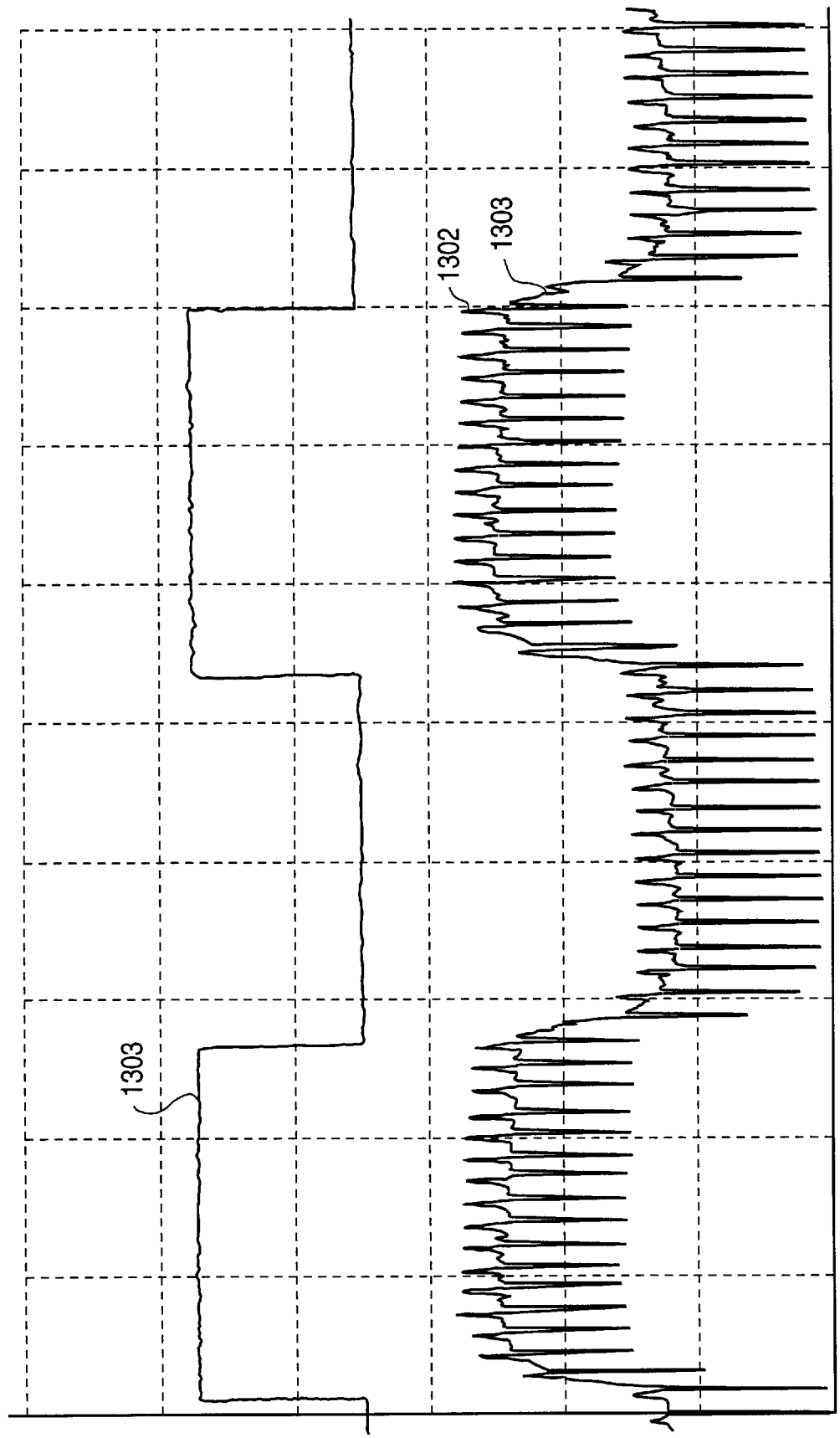
FIG. 13B shows the interconnect signal superimposed upon the solenoid signal.

FIG. 13A shows the reset signal 1301 which occurs at the beginning of each test loop, and chip signal 1302 which is the signal out of differential amplifier 611 described earlier in conjunction with FIG. 6. In FIG. 13A, the time interval per division is 20 $\mu$s. The measurements shown and described in relationship to FIGS. 13A and 13B are real-time. That is, the measurements shown in these Figures were generated without use of Bragg cell 1101. The data shown in FIGS. 13A and 13B were obtained using photodiodes 602 and 603 having a bandwidth of 300 kHz. While this bandwidth may be too low to resolve the AC component to the level desired in real-time measurements, such diodes have less noise than high frequency diodes. Further, use of stroboscopic measurements, as will be described below, result in high time response of the chip signal, even with these photodiodes. As shown in FIG. 13A, immediately after the reset signal, the chip signal 1302 drops to the zero current level 1304, as per the programming of the vector sequence of the clock pin. Following the zero current region 1304, is the region 1305 which shows the current in the functioning chip. The difference between the signal in the region 1304, and the average signal in the region 1305, as shown by distance bar 1306, shows the approximate average DC current level of the chip. It will be appreciated that the chip and solenoid signal shown in FIGS. 13A and 13B show the output of differential amplifier 611 as it would appear on an oscilloscope screen. Alternatively, a numerical value of the output of differential amplifier 611, in for example, millivolts may also be obtained. It will further be appreciated that the exact output will depend on, for example, the various gains of the amplifiers, and other factors, so that some reference is necessary to determine the relationship between the signals obtained, and the actual current.

FIG. 13B shows solenoid signal 1303 and chip signal 1302 superimposed on solenoid signal 1303. In FIG. 13B, each division along the x-axis represents one $\mu$s. Therefore, chip signal 1302 is compressed in FIG. 13B as compared to FIG. 13A. As described earlier, solenoid signal 1303 is at approximately $\frac{1}{32}$ the frequency of the chip signal 1302, so that there are approximately 32 cycles of chip signal 1302 per cycle of solenoid signal 1303. By using a different frequency, the solenoid signal may easily be differentiated from the chip signal. By using a synchronized solenoid frequency of $\frac{1}{2^n}$, the chip and solenoid waveforms can be superimposed on an oscilloscope screen. In FIG. 13B, the distance 1306 of FIG. 13A appears as spikes. As mentioned, this distance is proportional to the average DC current. As shown, solenoid signal 1303 has been adjusted so that its magnitude is approximately equal to the magnitude of the amplitude of chip signal 1302 for the reasons discussed previously. By stopping the clock as described above, a reference zero value is obtained, so that zero-referenced values for both the solenoid and chip signals can be obtained by subtracting the reference zero signal from each of the solenoid and the chip signals. Thus, the ratio a of equation (5) can then be determined by a comparison of these two zero-referenced signals.

Figure 13C:
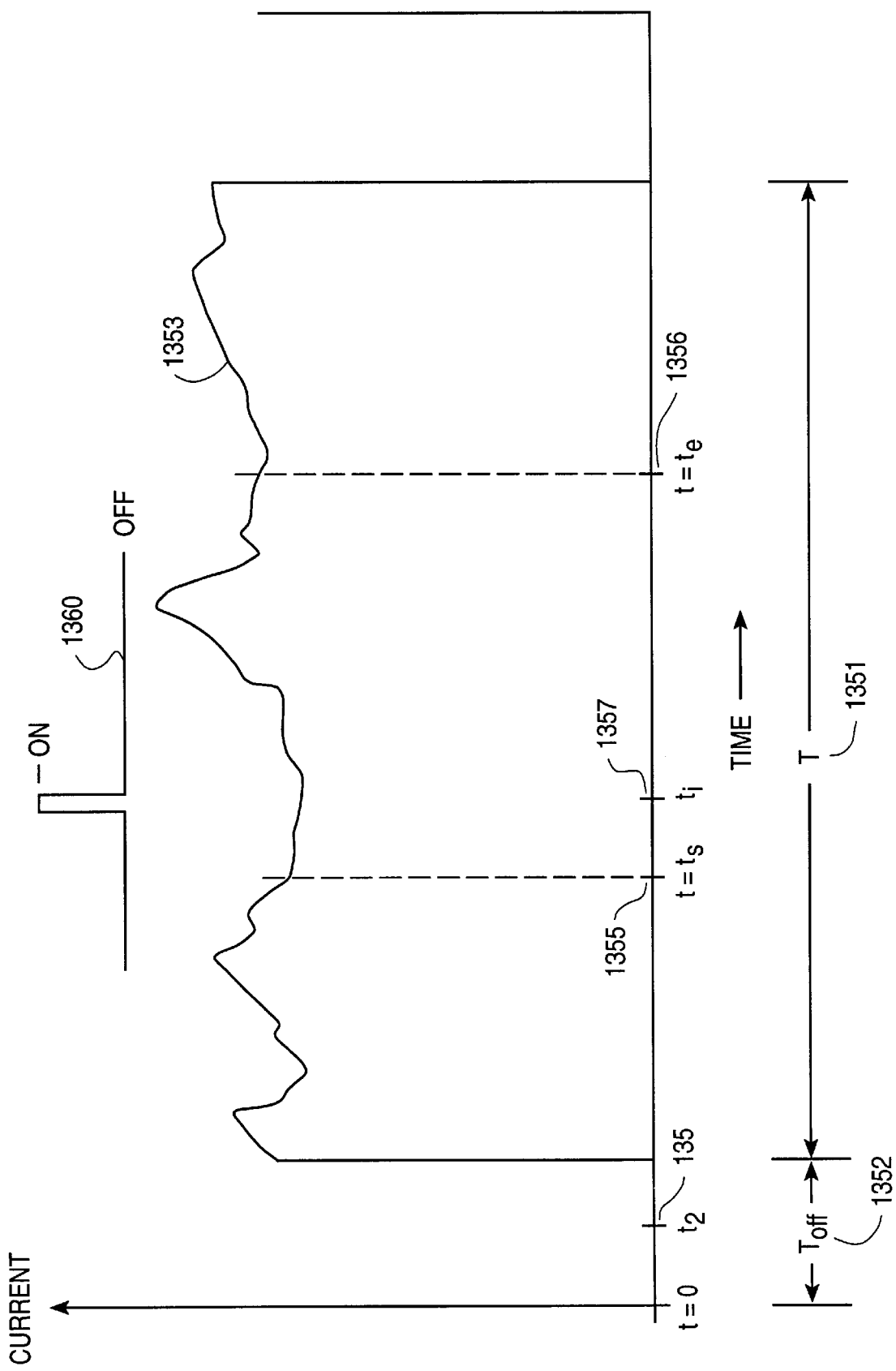
FIG. 13C illustrates stroboscopic current measurement.
Figure 13D:
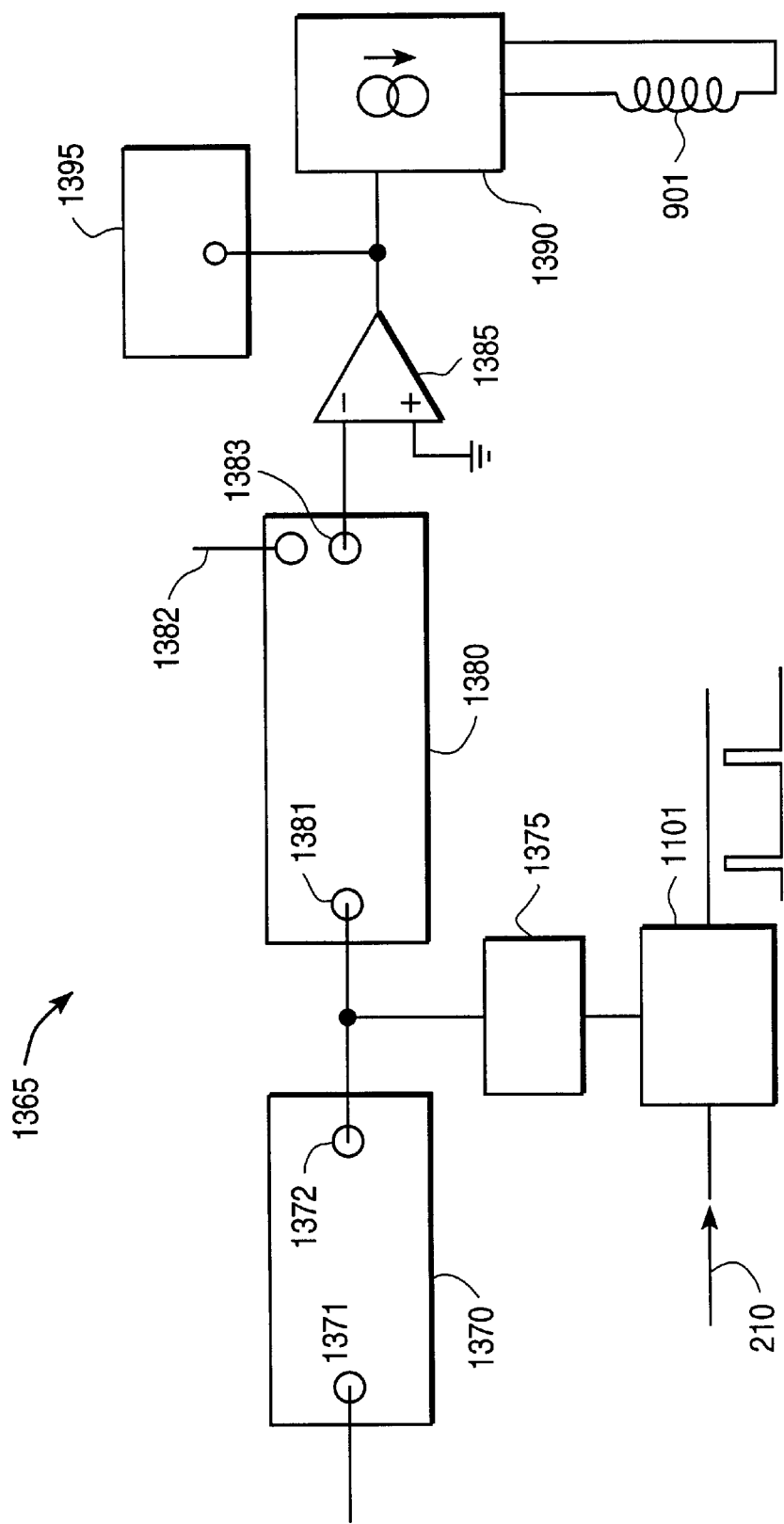
FIG. 13D shows a schematic diagram of a closed loop measurement system.

The principle of stroboscopic measurement will now be described in relation to FIG. 13C. FIG. 13C illustrates current in the interconnect line as a function of time. As shown, the chip is run through a test loop having a duration T, shown as 1351. As shown, a short time, $T_{off}$, 1352 is added (from the time t=0 to the beginning of the time period T) when the clock is frozen for the zero current reference. The chip signal 1353 is shown for the test loop and during the clock stopping. Typically, it will desired to measure a portion of the cycle such as from $t=t_s$ 1355 to $t=t_e$ 1356. Of course, if desired the chip signal can be measured over any portion or all of the cycle. The waveform from $t_s$ 1355 to $t_e$ 1356 is built up on a point by point basis. As described in relation to FIG. 11, at each point the laser beam 210 is pulsed on by the Bragg cell for a short period of duration $\tau$. The point at which the beam is pulsed on is controlled by a digital delay generator which delays the pulse for a set time from the beginning of the loop to the point of interest. If the scanned period from $t=t_s$ to $t=t_e$ is broken into N points, then there will be (N−1) intervals each having a value of $(t_e-t_s)/(N-1)$. At each of the points, the rotation is zero-referenced, and is measured through solenoid calibration. Since the test loop is a precisely repeating loop, the laser can be pulsed on by the digital delay generator at precisely the same delay for as many loops as is necessary to obtain sufficient signal to noise ratio.

In one embodiment of the present invention, a closed loop measurement is performed. In this method, the measured rotation is forced to zero in the electronic feedback loop 1365 shown in FIG. 13D. The electronic feedback loop 1365 is discussed in more detail immediately below. In general, the feedback loop 1365 allows for measurement of the chip rotation by adjusting the signal driving the solenoid current source 1390 such that the rotation signal from the solenoid is the negative of the rotation signal from the chip. Therefore, by measuring the signal driving the solenoid when the net rotation is equal to zero, a direct measure of the negative of the chip rotation is obtained. Referring to FIG. 13C, the measurement of current for an intermediate point, $t_i$, 1357 is illustrated. First, the rotation signal at $t_i$ is measured by pulsing the laser on as shown by graph 1360. As referred to above, the digital delay generator 1370 pulses the laser at precisely $t_i$. At each point such as ti, a certain amount of time is allowed for settling of the feedback loop 1365 so that a sufficiently good signal to noise ratio is built up. Boxcar averager 1380 averages the signal from the differential amplifier 611 described previously. An averaged output 1383 from boxcar averager 1380 is fed into the feedback differential amplifier 1385 to ensure that the input (i.e., the measured rotation signal) is maintained close to zero. After a stable average is built up, the value of the signal driving the solenoid current source 1390, i.e., the output of differential amplifier 1385 is acquired by data acquisition module 1395 and subsequently stored in the computer controlling the system (not shown). As described above, this output of differential amplifier 1385 is a direct measure of the rotation caused by the chip alone. Next, this procedure is then performed at a time such as $t_z$ 1357 during which the clock is frozen. The difference between the signal at $t_i$ and $t_z$ thus gives a zero-referenced, low noise value for the signal to the solenoid, and thus the negative of the chip signal at the time $t_i$. This procedure is repeated for all points between $t_s$ and $t_e$. If the drift in the zero-reference is small, the measurement at $t_z$ need not be performed for every point between $t_s$ and $t_e$, and may be done less frequently to cut down on measurement time. Note that in this method, since the measured rotation is forced to zero by adjusting the solenoid, the field from the solenoid is assured to be the same as the field from the chip at every point, thus eliminating any non-linearities. Note that in the case of the real-time measurements, the solenoid signal is on average the same as the chip signal, but not necessarily the same on a point by point basis. Note that while this method is especially useful for achieving high frequency response, it can also be used to automate DC measurements. In this case, the pulse width can be increased to, for example, 1 $\mu s$ or greater, giving very high signal to noise ratio. An advantage to this method is that the solenoid is always left on and the loop is always closed. This is desirable since opening the loop may lead to problems associated with long settling times.

Referring again to FIG. 13D, a schematic diagram of the circuit for the above described closed loop measurement is shown. Digital delay generator 1370 receives at input 1371 the reset signal from the IMS tester described previously. As described above, the digital delay generator 1370 generates a delay from the time t=0 to the point at which a measurement is to be taken. The signal from the digital delay generator 1370 is output at 1372 to pulse generator 1375 which generates a pulse to control Bragg cell 1101 to produce a laser pulse at the time of interest (e.g., a point between $t_s$ and $t_e$, or $t_z$). Additionally, the output 1372 of digital delay generator 1370 is received at input 1381 of boxcar averager 1380. This trigger indicates to the boxcar averager 1380 when it is to take a measurement for averaging. Boxcar averager 1380 receives at input 1382 the signal from differential amplifier 611, and produces an averaged signal at output 1383, which is then fed to high gain feedback amplifier 1385. The output from the differential amplifier 1385 is fed to current source 1390, which drives solenoid 901 such that the measured signal is zero. Additionally, as shown, the output of amplifier 1385, which is a direct measure of the negative of the chip rotation, is fed to data acquisition module 1395 which comprises an analog to digital converter. The digitized signal out of data acquisition module 1395 is then fed to the computer, to be stored as described before to produce the chip waveform. In a currently preferred embodiment, digital delay generator 1370, pulse generator 1375, boxcar averager 1380, and data acquisition module 1395 are coupled via a general purpose interface bus (GPIB, IEEE standard 488) to the computer described herein (not shown) for computer control as described generally herein.

If desired, several open loop methods may be performed. In this case, the chip and zero-reference are measured directly at the output of the boxcar averager and stored in the computer (as opposed to taking the measurement from the output of the feedback amplifier as in the closed loop method). The solenoid is then independently turned on and the rotation caused by it is measured by the computer and used to calibrate the zero-referenced chip rotation data. This may be done by first measuring the zero-referenced waveform with the solenoid disabled. That is, at each point such as $t_i$ a measurement is taken and fed to the boxcar averager. In, for example, the next cycle a measurement is taken at $t_z$. The boxcar averager produces the average signal for the measurement at $t_i$ minus the measurement at $t_z$ (the zero-referenced chip rotation). If the zero-reference drift is not significant, the entire waveform can be measured while the zero-reference is sampled only periodically, captured, and stored in the computer and subtracted from the waveform in software. Next, the solenoid is turned on and zero-referenced measurements are taken with the solenoid on. The current to the solenoid is adjusted by the computer until the zero-referenced rotation with the solenoid on includes a contribution from the solenoid equal to about the average of the zero-referenced chip measurement with the solenoid off. This method ensures that the solenoid is generating a magnetic field within the dynamic range of the chip waveform, but this does not guarantee that any non-linearities in the measurement are automatically canceled, since this method, in contrast to the closed loop method, does not produce a solenoid signal equal to the chip signal at every point. A further open loop method is to emulate the closed loop measurement method approximately in software. At each point in time, with the solenoid disabled, the zero-referenced chip signal is first measured and stored in the computer. The solenoid is then turned on (but it should be disabled during the zero-reference part of the loop) and the current is adjusted until the measured rotation is zero. This method will take longer than the pure closed loop method, however.

As described herein, the present invention determines current by measuring the magnetic field near an interconnect line. It will be appreciated that the field at any given point will include contributions from sources other than the interconnect line of interest. Therefore, methods of deconvolving the contributions from other current sources are desirable in many circumstances. As will be described below, different methods may be used depending upon the particular layout, degree of accuracy required, and system setup.

One simple deconvolution method that may be used on an isolated line assumes that the cross-talk fields at the two edges of a line are approximately equal. For example, referring back to FIG. 3, a first measurement is taken at edge 305 and a second measurement is taken at edge 306. Since the magnetic field due to the interconnect line is in opposite directions, the rotation caused by the interconnect line at the edges 305 and 306 will be in opposite directions, and of equal magnitude. Therefore, if the signals are subtracted, the signal due to the interconnect line is equal to twice the rotation at one of edges 305 or 306. However, since the common mode interference is in the same direction at both edges, this component is subtracted out.

Figure 14:
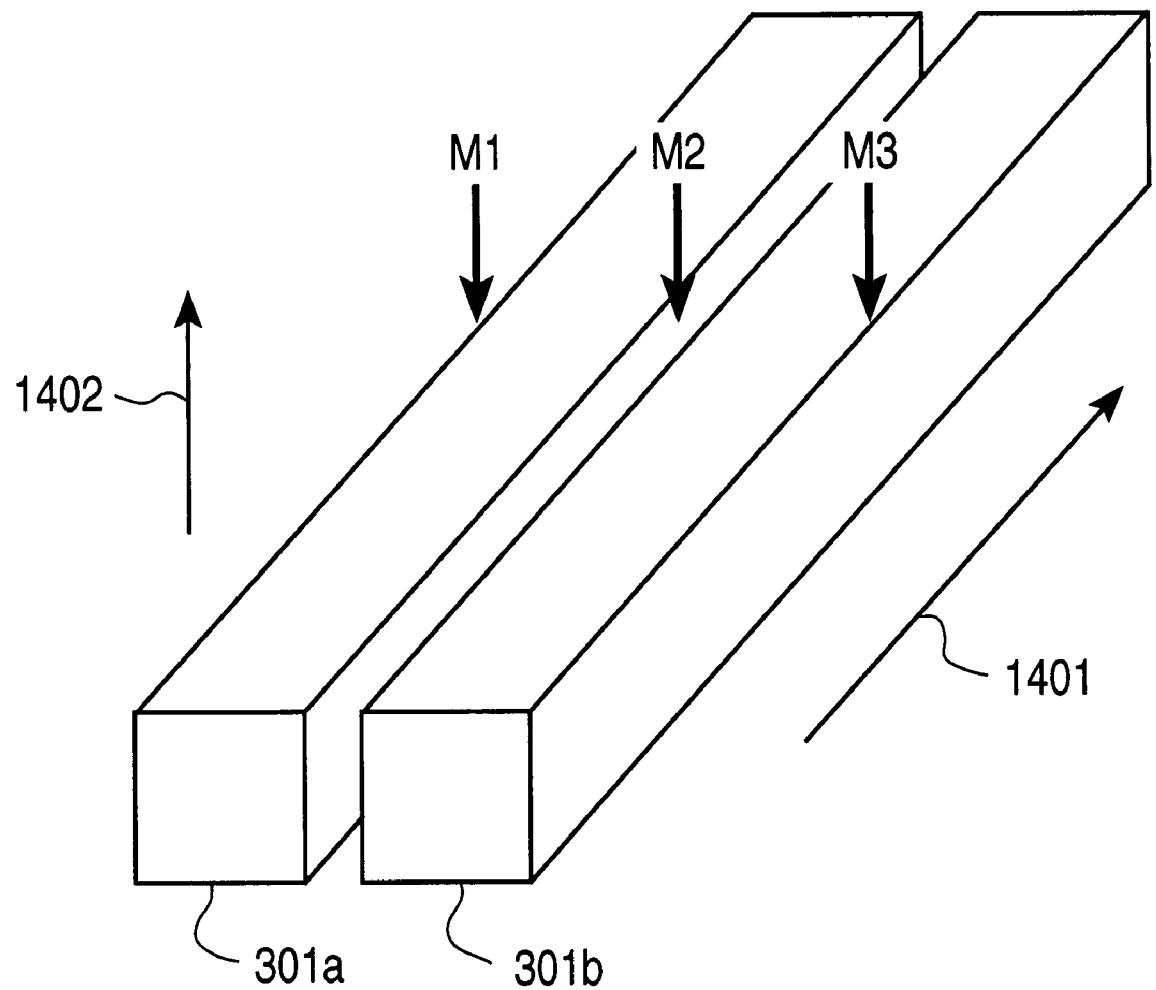
FIG. 14 illustrates one method of deconvolving the contributions from different current sources.

While the above described method works well for isolated lines, in typical devices many or all of the bus lines occur in pairs. That is, a $V_{CC}$ line is typically adjacent or parallel to a $V_{SS}$ line. In such a case, the cross-talk field is not equal at both edges, and methods of deconvolution using a knowledge of the field produced as a function of position from the source may be utilized. The field produced from a source, as a function of position, is the same form as described earlier in conjunction with equation (2), and described in the section entitled "Magnetic Field Calculation" below. FIG. 14 shows a case where two unknown currents are flowing through two interconnect lines. The simulated field per unit current, referred to previously as f(x,y,z) will be referred to for the purposes of the deconvolution discussion as $K_{a1}$, $K_{b1}$, etc. where $K_{a1}$ is the field due to a source such as interconnect line 301a of FIG. 14 at measurement point 1, $K_{b1}$ is the field due to interconnect line 301b at measurement point 1, etc. The defined direction of positive current is shown by arrow 1401 and the defined direction of positive field is shown by 1402. Only two measurements (e.g., M1, M2) need to be made to solve for the two unknown currents. However, additional redundant measurements (e.g., M3) can also be made to cross check the data. For example, three measurements are taken at measurement points M1, M2, and M3. Denoting the values obtained at measurement points M1, M2, and M3 as $m_1$, $m_2$, and $m_3$, respectively, and writing the resulting equations in vector form:

$$\begin{bmatrix} m_1 \\ m_2 \end{bmatrix} = \begin{bmatrix} K_{a1} & K_{b1} \\ -K_{a2} & K_{b2} \end{bmatrix} \begin{bmatrix} I_a \\ I_b \end{bmatrix}$$

$$\begin{bmatrix} m_2 \\ m_3 \end{bmatrix} = \begin{bmatrix} -K_{a2} & K_{b2} \\ -K_{a3} & K_{b3} \end{bmatrix} \begin{bmatrix} I_a \\ I_b \end{bmatrix}$$

where $I_a$ and $I_b$ are the currents through lines 301a and 301b, respectively. Note that when solved, for each set of three measurements, two values of the currents $I_a$ and $I_b$ are obtained, providing a useful cross check. In many chips, due to the large number of lines, interfering fields from lines besides the two lines of interest shown in FIG. 14 may be present. If desired, the above method can be extended to N lines and N measurement points to recover the N currents by building an N×N matrix. However, a difficulty with this method in a complex chip is that the bounds of N are generally not known and if N becomes very large the deconvolution may become unwieldy.

Figure 15:
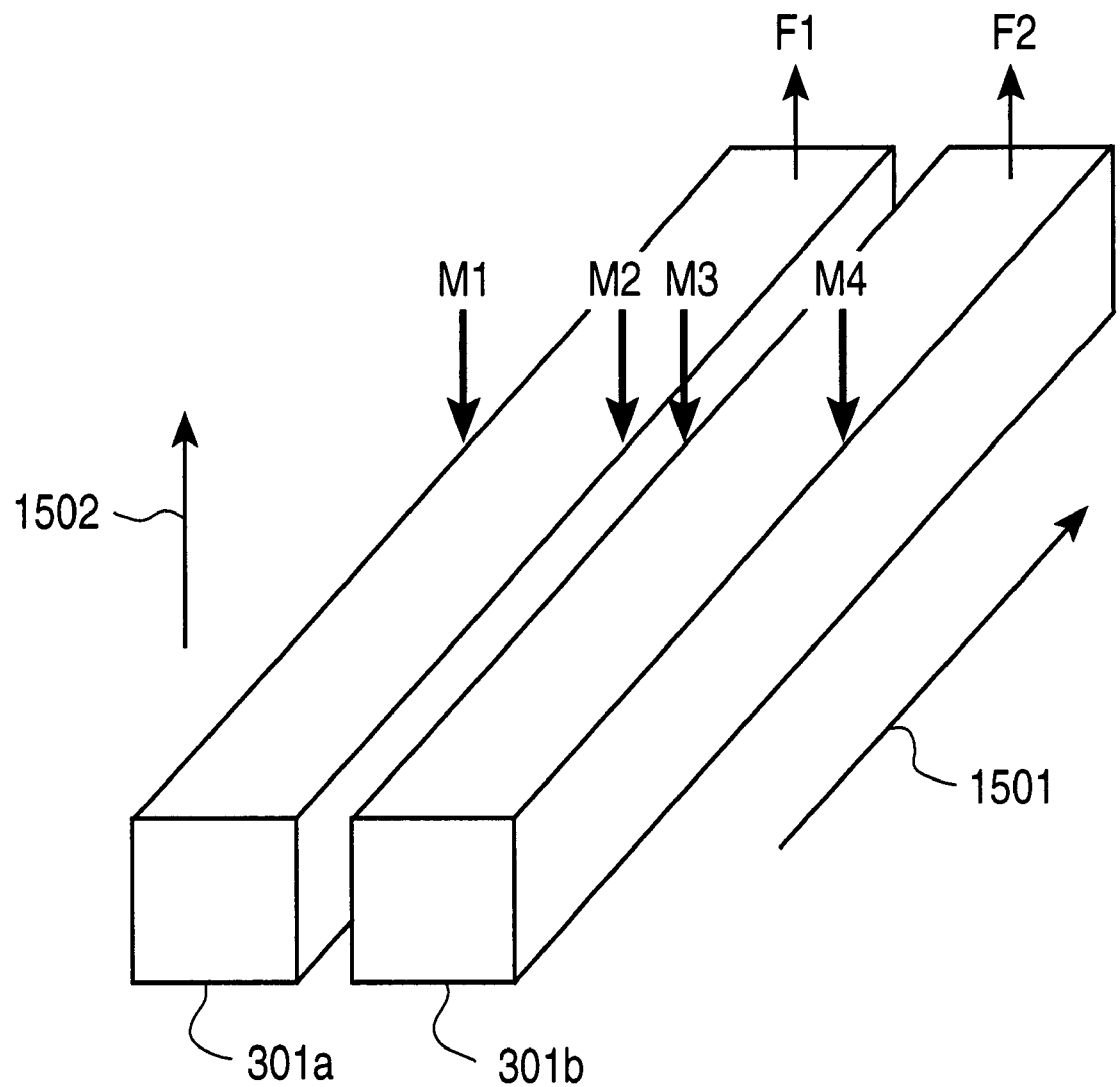
FIG. 15 shows a further method of deconvolving the contributions from different current sources.
Figure 16:
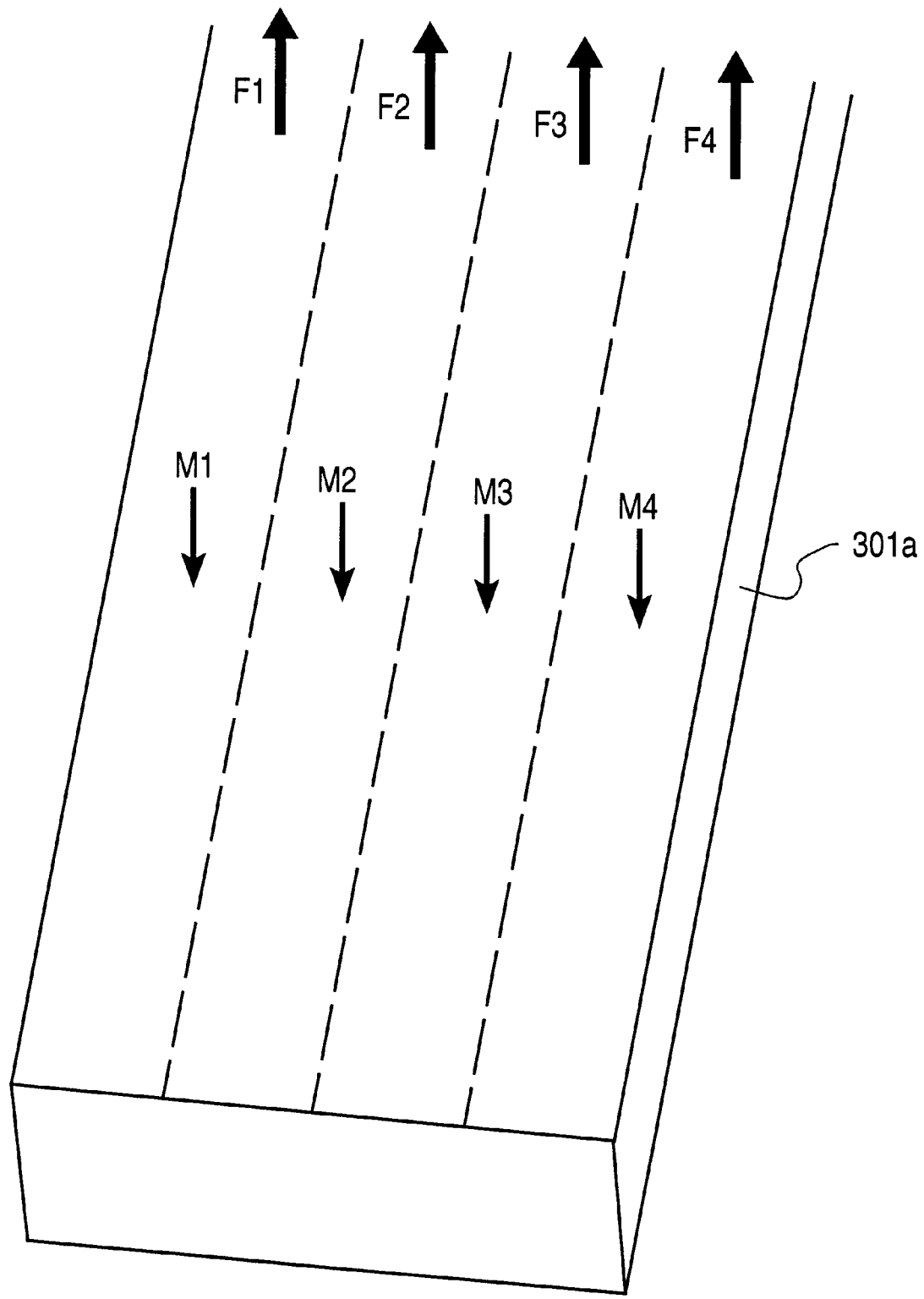
FIG. 16 shows a further method of deconvolving the contributions from different current sources.

FIG. 15 and FIG. 16 illustrate another method in which only the lines through which the current flow needs to be known are modeled. This method assumes that the combined interference caused by all other lines can be lumped into one unknown field above the measurement point. As illustrated in FIG. 15, lines 301a and 301b are assumed to have a constant field $f_1$, and $f_2$, respectively, across the width of each of the lines. In this method the field $f_1$ is assumed to be constant across the width of line 301a, and the field $f_2$ is assumed to be constant across the width of line 301b. Four measurements are taken at the points M1, M2, M3, and M4, as shown. The defined direction of positive current and positive field are shown by arrows 1501 and 1502. The resulting equations, in vector form are as follows:

$$\begin{bmatrix} m_1 \\ m_2 \\ m_3 \\ m_4 \end{bmatrix} = \begin{bmatrix} K_{a1} & K_{b1} & 1 & 0 \\ -K_{a2} & K_{b2} & 1 & 0 \\ -K_{a3} & K_{b3} & 0 & 1 \\ -K_{a4} & -K_{b4} & 0 & 1 \end{bmatrix} \begin{bmatrix} I_a \\ I_b \\ F_1 \\ F_2 \end{bmatrix}$$

FIG. 16 shows a slightly different implementation of the method described in conjunction with FIG. 15, which recovers the current through single interconnect line 301. First the interconnect line is broken into n sections, each having a cross-talk field $f_n$ which is different from a nearby section. Thus, the cross-talk field is assumed to be constant only over each individual subsection. The accuracy of this method can be made greater by dividing the line into a greater number of subsections and taking a measurement over each. In FIG. 16, four such subsections are shown for illustration. As shown, each is assumed to have an interfering field $f_1$–$f_4$. Also as shown, four measurements, $M_1$–$M_4$ are taken across the width of the interconnect line 301. The measured field at, for example, section 1 can be expressed as:

$m_1 = K_{a1}I_a + f_1$
$m_2 = K_{a2}I_a + f_2$
$m_3 = K_{a3}I_a + f_3$
$m_4 = K_{a4}I_a + f_4$

In order to reduce the number of unknowns by one, so that the above equations can be solved, two adjacent fields are assumed to be equal. That is, for example, in the above example, $f_3$ is set equal to $f_2$. With this assumption, the above equations can be solved to determine Ia, the current through line 301a. Note that with the line 301a broken into a sufficient number of subsections, the assumption that two adjacent cross-talk fields are equal introduces very little error. Alternatively, an additional measurement can be taken in any one of the sections, for example, the section having the field $f_3$ to produce an additional equation (e.g., $m5 = K_{a5}I_a + f_3$) so that the equation can be solved for the unknown current $I_a$. In the above methods of deconvolution shown in FIGS. 14–16, the measurements were shown as being taken over the interconnect line. Of course, theoretically, the measurements may be taken anywhere, so long as the calculated field (i.e., the function denoted by K) is calculated for the point at which the measurement is taken. However, it will be appreciated that for greatest sensitivity, measurements over the line, including some near the edges of the line, will provide the most sensitivity for the reasons discussed earlier.

Appendix A gives a listing of a program, written in FORTRAN, that calculates the Faraday rotation undergone by a polarized laser beam due to the magnetic fields generated by an arbitrarily directed set of current carrying wires of rectangular cross-section. Appendix B gives a FORTRAN listing of a program that reads the output of the program in Appendix A to deconvolve the signals captured by the laser probe of the present invention. It should be noted that the program of Appendix B was written for use with a different solenoid circuit than that illustrated in FIG. 9, so that appropriate adjustments need to be made where appropriate for the actual solenoid circuit being used. It will be appreciated that Appendix B teaches the general principles behind the deconvolution program.

Thus, a method and apparatus for measuring a magnetic field of, for example, an interconnection line, and calculating current through the line from the measured magnetic field, has been described. Although specific embodiments, including specific equipment, parameters, methods, and materials have been described, various modifications to the disclosed embodiments will be apparent to one of ordinary skill in the art upon reading this disclosure. Therefore, it is to be understood that such embodiments are merely illustrative of and not restrictive on the broad invention and that this invention is not limited to the specific embodiments shown and described.

Magnetic Field Calculation

Consider a simple rectangular interconnect line of length 2l (z directed), height 2h and width 2w. Assume a uniform current density $\bar{J}$ exists in the interconnect line. The flux density at a general point P having the coordinates $x_p$, $y_p$, $z_p$, is given by the Biot-Savart law as.

$$\bar{B}(x_p, y_p, z_p) = \frac{\mu}{4\pi} \int \frac{\bar{J} \times (\bar{r} - \bar{r}')\, dV}{|\bar{r} - \bar{r}'|^3} \qquad \text{M1}$$

as
where $\bar{r}'$ is the vector to a general point within the volume element dV where the current density exists, and $\bar{r}$ is the vector to the observation point P. $\bar{r}$ and $\bar{r}'$ are given by:

$$\bar{r} = x_p \bar{i} + y_p \bar{j} + z_p \bar{k} \qquad \text{M2}$$

$$\bar{r}' = x\bar{i} + y\bar{j} + z\bar{k} \qquad \text{M3}$$

$$\text{let } \bar{J} = J(S_x \bar{i} + S_y \bar{j} + S_z \bar{k}) \qquad \text{M4}$$

Where $S_x$, $S_y$, and $S_z$ are direction consines. Then:

$$(\bar{r} - \bar{r}') = (x_p - x)\bar{i} + (y_p - y)\bar{j} + (z_p - z)\bar{k} \qquad \text{M5}$$

let $u = (x_p - x)$, $v = (y_p - y)$, and $w = (z_p - z)$, then:

$$\bar{r} - \bar{r}' = \bar{i}u + \bar{j}v + \bar{k}w \qquad \text{M6}$$

$$|\bar{r} - \bar{r}'| = [u^2 + v^2 + w^2]^{1/2} \qquad \text{M7}$$

$$\bar{J} \times (\bar{r} - \bar{r}') = \bar{i}(S_y w - S_z v) + \bar{j}(S_z u - S_x w) + \bar{k}(S_x v - S_y u) \qquad \text{M8}$$

Equation (1) becomes:

$$B(x_p, y_p, z_p) = \qquad \text{M9}$$

$$\frac{J\mu}{4\pi}\left\{ \bar{i} \int \frac{S_y w - S_z v}{(u^2 + v^2 + w^2)^{3/2}} dV + \bar{j} \int \frac{(S_z u - S_x w)}{(u^2 + v^2 + w^2)^{3/2}} dV + \bar{k} \int \frac{S_x w - S_y u}{(u^2 + v^2 + w^2)^{3/2}} dV \right\}$$

Therefore, in the most general case three triple volume integrals must be evaluated as follows:

$$-\iiint \frac{u\, du\, dv\, dw}{(u^2 + v^2 + w^2)^{3/2}} \qquad \text{M10}$$

$$-\iiint \frac{v\, du\, dv\, dw}{(u^2 + v^2 + w^2)^{3/2}} \qquad \text{M11}$$

$$-\iiint \frac{w\, du\, dv\, dw}{(u^2 + v^2 + w^2)^{3/2}} \qquad \text{M12}$$

The negative sign arises because of the change of variable from $d_x d_y d_z$ to dudvdw, since $u = x_p - x$ so that $du = -dx$. Because of the symmetry it is only necessary to evaluate one of these. The others are obtained by changing the variable. Denoting the result of the first integration as $I_1$, and letting $(v^2 + w^2) = a^2$, for equation M10:

$$I_1 = \iiint \frac{u\, du\, vd\, w}{(u^2 + a^2)^{3/2}} \qquad \text{M13}$$

Using a table of integrals, such as that found in the Handbook of Physics and Chemistry, this evaluates with respect to u as:

$$\frac{-1}{\sqrt{u^2 + a^2}} \qquad \text{M14}$$

If the upper and lower limits of u are $u_u$ and $u_l$, then:

$$I_1 = \iint \frac{dv\, dw}{\sqrt{u_u^2 + a^2}} - \iint \frac{dv\, dw}{\sqrt{u_l^2 + a^2}} \qquad \text{M15}$$

$$= I_{1u} - I_{1l} \qquad \text{M16}$$

Next, equation M15 must be integrated with respect to v. Denoting the result as $I_2$, and evaluating the general form of the integral in M15:

$$I_2 = \iint \frac{dv\, dw}{\sqrt{u^2 + a^2}} \qquad \text{M17}$$

Recalling that $u^2 + a^2 = u^2 + v^2 + w^2$, and letting $u^2 + w^2 = b^2$, then:

$$I_2 = \iint \frac{dv\, dw}{(v^2 + b^2)^{1/2}} \qquad \text{M18}$$

Again using a table of integrals, this evaluates with respect to v as:

$$\log\left\{ \frac{v + \sqrt{v^2 + b^2}}{b} \right\} \qquad \text{M19}$$

so that $I_2 =$ \qquad M20

$$\int \log\left\{ \frac{v_u + \sqrt{v_u^2 + b^2}}{b_u} \right\} dw - \int \log\left\{ \frac{v_l + \sqrt{v_l^2 + b^2}}{b_l} \right\} dw$$

The general integral here is:

$$I_2 = -\int \log b\, dw + \int \log\left\{ v + \sqrt{v^2 + b^2} \right\} dw \qquad \text{M21}$$

Now let:

$$I_{2a} = -\int \log b\, dw = -\tfrac{1}{2} \int \log(u^2 + w^2)\, dw \qquad \text{M22}$$

Then:

$$I_{2a} = -\tfrac{1}{2} w \log(u^2 + w^2) + w - u \tan^{-1} w/u \qquad \text{M23}$$

Next, the second integral in equation M21 must be evaluated with respect to w. Denoting the result as $I_3$, and evaluating the general form:

$$I_{2a} = -\int \log b\, dw = -\tfrac{1}{2} \int \log(u^2 + w^2)\, dw \qquad \text{M22}$$

Then:

$$I_{2a} = -\tfrac{1}{2} w \log(u^2 + w^2) + w - u \tan^{-1} w/u \qquad \text{M23}$$

Next, the second integral in equation M21 must be evaluated with respect to w. Denoting the result as $I_3$, and evaluating the general form:

$$I_3 = \int \log\{v + \sqrt{v^2 + b^2}\} dw \qquad \text{M24}$$

Recalling that $v^2+b^2=v^2+u^2+w^2$ and letting $v^2+u^2=c^2$, then:

$$I_3 = \int \log\{v + \sqrt{c^2 + w^2}\} dw \qquad \text{M25}$$

Now let $w=c\tan\theta$, so that $$\sqrt{c^2 + w^2} = c\sec\theta, \text{ and } dw = c\sec^2\theta d\theta, \text{ then:} \qquad \text{M26}$$

$$I_3 = \int \log\{v + c\sec\theta\}\{c\sec^2\theta\} d\theta$$

Integrating by parts:

$$ds = \left(\frac{c\sec\theta\tan\theta}{v + c\sec\theta}\right) d\theta \qquad \text{M29}$$

$$I_3 = c\tan\theta\log\{v + c\sec\theta\} - \int \frac{c^2\sec\theta\tan^2\theta}{(v + c\sec\theta)} d\theta \qquad \text{M31}$$

$$\downarrow$$

$$I_4$$

The integral denoted $I_4$ must be evaluated. Using the relationship:

$$\tan^2\theta=\sec^2\theta-1=(\sec\theta+1)(\sec\theta-1) \qquad \text{M32}$$

then:

$$I_4 = \int \frac{c^2\sec\theta(\sec\theta + 1)(\sec\theta - 1)}{v + c\sec\theta} d\theta \qquad \text{M33}$$

Since $\sec\theta=1/\cos\theta$ $$I_4 = \int \frac{c^2(\sec\theta + 1)(\sec\theta - 1)}{c + v\cos\theta} d\theta \qquad \text{M34}$$

leting $v/c=P$, and since $$(1 + \sec\theta) = \frac{1}{\cos\theta}(1 + \cos\theta) \qquad \text{M35}$$

$$I_4 = \int \frac{c(\sec\theta - 1)(1 + \cos\theta) d\theta}{\cos\theta \ (1 + P\cos\theta)}$$

now let $(1+\cos\theta)=(1+P\cos\theta)+(\cos\theta-P\cos\theta)$ $$I_4 = \int \frac{c(\sec\theta - 1)}{\cos\theta}\left\{1 + \frac{\cos\theta(1 - P)}{(1 + P\cos\theta)}\right\} d\theta \qquad \text{M36}$$

$$= \int \left\{\frac{c(\sec\theta - 1)}{\cos\theta} + \frac{c(1 - P)\sec\theta}{(1 + P\cos\theta)} - \frac{c(1 - P)}{(1 + P\cos\theta)}\right\} d\theta \qquad \text{M37}$$

Therefore:

$$I_4 = \int \left\{\frac{c}{\cos^2\theta} - \frac{c}{\cos\theta} + \frac{c(1 - P)}{\cos\theta(1 + P\cos\theta)} - \frac{c(1 - P)}{(1 + P\cos\theta)}\right\} d\theta \qquad \text{M38}$$

This evaluates as follows:

$$\int \frac{c}{\cos^2\theta} = c\tan\theta \qquad \text{M39}$$

$$\int \frac{c}{\cos\theta} d\theta = c\log\tan\left(\frac{\pi}{4} + \frac{\theta}{2}\right) \qquad \text{M40}$$

$$\int \frac{c(1 - P)}{\cos\theta(1 + P\cos\theta)} d\theta = \qquad \text{M41}$$

$$c(1 - P)\left\{\log\tan\left(\frac{\theta}{2} + \frac{\pi}{4}\right) - P\left[\frac{2}{\sqrt{1 - P^2}}\tan^{-1}\frac{\sqrt{1 - P^2}\tan\theta/2}{1 + P}\right]\right\}$$

$$\int \frac{c(1 - P)}{1 + P\cos\theta} d\theta = c(1 - P)\left\{\frac{2}{\sqrt{1 - P^2}}\tan^{-1}\frac{\sqrt{1 - P^2}\tan\theta/2}{1 + P}\right\} \qquad \text{M42}$$

Some trigonometric identities that will be useful are:

$$\tan\frac{\theta}{2} = \frac{1 - \cos\theta}{\sin\theta} \qquad \text{M43}$$

$$\tan\left[\frac{\pi}{4} + \frac{\theta}{2}\right] = \frac{1 + \tan\theta/2}{1 - \tan\theta/2} \qquad \text{M44}$$

With the following abbreviations:

$$u = A1, v = A2, w = A3 \qquad \text{M45}$$
$$c = \sqrt{A2^2 + A1^2}$$

$$P = A2/c \qquad \text{M46}$$

$$\tan\theta = A3/c \qquad \text{M47}$$

$$\sec\theta = \sqrt{1 + \tan\theta^2} \qquad \text{M48}$$

$$\cos\theta = 1/\sec\theta \qquad \text{M49}$$

$$\sin\theta = \tan\theta\cos\theta \qquad \text{M50}$$

$$T2 = \tan\left(\frac{\theta}{2}\right) = \frac{1 - \cos\theta}{\sin\theta} \qquad \text{M51}$$

$$T2P = \tan\left(\frac{\theta}{2} + \frac{\pi}{4}\right) = \frac{1 + T2}{1 - T2} \qquad \text{M52}$$

$$PM = 1 - P \qquad \text{M53}$$

$$PP = 1 + P \qquad \text{M54}$$

$$P2 = \sqrt{1 - P^2} \qquad \text{M55}$$

$$P4 = \frac{2}{P2}\tan^{-1}\left\{\frac{P2T2}{PP}\right\} \qquad \text{M56}$$

$$D31 = \tan^{-1}\frac{A3}{A1} \qquad \text{M57}$$

$$DL = \log\{T2P\} \qquad \text{M58}$$

Then the general integral for one set of limits A1, A2, A3 is:

$$I = \frac{-1}{2} A3\log(A1^2 + A3^2) + A3 - A1D31 + \quad \text{M59}$$
$$c\{\tan\theta\log(A2 + c\sec\theta) - [\tan\theta - DL + PM(DL - (PP)(P4))]\}$$

This is the complete solution for the case when A1, A2, A3≠0. When A1, A2, and/or A3=0, appropriate modification can be made to eliminate the singularity. For example, in the case of when the integration is performed from the surface of the interconnect line, so that A1=0, A1 can be given a very small non-zero value.

What is claimed is:

1. A system for measurement of an unknown magnetic field comprising:
   a radiation source, said radiation source emitting radiation;
   a polarizer disposed to polarize said radiation, producing polarized radiation;
   a material that rotates said polarized radiation in the presence of said unknown magnetic field and disposed such that said polarized radiation passes through said material;
   a magnetic field source producing a known magnetic field in said material; and
   a detector to measure said rotation of said polarized radiation by comparing the rotation caused by said unknown magnetic field with the rotation caused by said known magnetic field, wherein said system determines a current through a conductor, said material disposed proximate said conductor, wherein said conductor is an interconnection line on a semiconductor device, said system further comprising a tester to run a test pattern on said semiconductor device.

2. The system as described in claim 1 further comprising a clock system, said clock system providing a clock signal to said semiconductor device, wherein said clock signal is frozen for a portion of said test pattern.

3. The system as described in claim 2 wherein said known magnetic field has a magnitude approximately equal to that of said unknown magnetic field.

4. The system as described in claim 2 further comprising:
   a beam splitter that splits said polarized radiation that has passed through said material into a first and a second orthogonal component;
   a rotator prior to said beam splitter to rotate the polarization of said polarized radiation that has passed through said material; and
   a first and a second detector disposed to detect said first and said second orthogonal components.

5. The system as described in claim 4 comprising an optical imaging system to provide said polarized radiation, said optical imaging system disposed on a precision positioning stage to position and polarized radiation relative to said semiconductor device.

6. The system as described in claim 2 comprising an optical imaging system to provide said polarized radiation, said optical imaging system disposed on a precision positioning stage to position said polarized radiation relative to said semiconductor device.

7. The system as described in claim 1 further comprising:
   a beam splitter that splits said polarized radiation that has passed through said material into a first and a second orthogonal component;
   a rotator prior to said beam splitter to rotate the polarization of said polarized radiation that has passed through said material; and
   a first and a second detector disposed to detect said first and said second orthogonal components.

8. The system as described in claim 7 further comprising an aperture prior to said beam splitter, aperture having a diameter less than a width of said beam.

9. The system as described in claim 8 comprising an optical imaging system to provide said polarized radiation, said optical imaging system disposed on a precision positioning stage to position said polarized radiation relative to said semiconductor device.

10. The system as described in claim 7 comprising an optical imaging system to provide said polarized radiation, said optical imaging system disposed on a precision positioning stage to position said polarized radiation relative to said semiconductor device.

11. The system as described in claim 1 wherein said known magnetic field has a magnitude approximately equal to that of said unknown magnetic field.

12. The system as described in claim 11 further comprising:
   a beam splitter that splits said polarized radiation that has passed through said material into a first and a second orthogonal component;
   a rotator prior to said beam splitter to rotate the polarization of said polarized radiation that has passed through said material; and
   a first and a second detector disposed to detect said first and said second orthogonal components.

13. The system as described in claim 12 comprising an optical imaging system to provide said polarized radiation, said optical imaging system disposed on a precision positioning stage to position said polarized radiation relative to said semiconductor device.

14. The system as described in claim 11 comprising an optical imaging system to said polarized radiation, said optical imaging system disposed on a precision positioning stage to position said polarized radiation relative to said semiconductor device.

15. The system as described in claim 1 comprising an optical imaging system to provide said polarized radiation, said optical imaging system disposed on a precision positioning stage to position said polarized radiation relative to said semiconductor device.

* * * * *

UNITED STATES PATENT AND TRADEMARK OFFICE
CERTIFICATE OF CORRECTION

PATENT NO. : 5,969,517
DATED : October 19, 1999
INVENTOR(S) : Rao

Page 1 of 1

It is certified that error appears in the above-identified patent and that said Letters Patent is hereby corrected as shown below:

Column 12,
Line 18, delete "1051" and insert -- 1051a --.
Line 19, delete "a".

Column 16,
Line 22, delete "a" and insert -- $\alpha$ --.
Line 67, delete "ti" and insert -- $t_i$ --.

Column 22,
Line 55, delete "Next, the second integral in equation M21 must be evaluated with respect to w. Denoting the result as $I_3$, and evaluating the general form:".
Lines 60-65, delete,
"$I_{2\alpha}$=-∫ log bdw=-1/2∫log $(u^2+w^2)$dw          M22
Then
"$I_{2\alpha}$=--1/2w log$(u^2+w^2)$+w-u tan$^{-1}$w/u          M23"

Column 23,
Line 21, after "parts:", insert:
  -- let          S=log{v+c sec $\theta$}          M27
   and          dt=c sec$^2$ $\theta$ d$\theta$          M28
   then --.
Line 25, after "ds= $(\frac{c \sec \theta \tan \theta}{v + c \sec \theta})$ d$\theta$          M29", insert:

-- and          t=ctan$\theta$          M30
then --.

Signed and Sealed this

Seventeenth Day of January, 2006

JON W. DUDAS
*Director of the United States Patent and Trademark Office*